US011916565B2

(12) United States Patent
Lee et al.

(10) Patent No.: US 11,916,565 B2
(45) Date of Patent: Feb. 27, 2024

(54) ANALOG-TO-DIGITAL CONVERTER

(71) Applicant: SAMSUNG ELECTRONICS CO., LTD., Suwon-si (KR)

(72) Inventors: Jaerin Lee, Yongin-si (KR); Minjae Lee, Gwangju (KR); Sewon Lee, Gumi-si (KR); Kyeongkeun Kang, Suwon-si (KR)

(73) Assignees: SAMSUNG ELECTRONICS CO., LTD., Suwon-si (KR); GWANGJU INSTITUTE OF SCIENCE AND TECHNOLOGY, Gwangju (KR)

( * ) Notice: Subject to any disclaimer, the term of this patent is extended or adjusted under 35 U.S.C. 154(b) by 190 days.

(21) Appl. No.: 17/673,416

(22) Filed: Feb. 16, 2022

(65) Prior Publication Data
US 2023/0011062 A1  Jan. 12, 2023

(30) Foreign Application Priority Data

Jul. 6, 2021  (KR) .................. 10-2021-0088569

(51) Int. Cl.
H03M 1/10  (2006.01)
(52) U.S. Cl.
CPC .................. H03M 1/1023 (2013.01)
(58) Field of Classification Search
CPC .......... H03M 1/10; H03M 1/46; H03M 1/002; H03M 1/1009; H03M 1/1023; H03M 1/468
See application file for complete search history.

(56) References Cited

U.S. PATENT DOCUMENTS 5,172,217 A * 12/1992 Perkins .................. H04N 9/74
348/727
6,289,070 B1 * 9/2001 Krone .................. H04L 25/06
341/120
(Continued)

FOREIGN PATENT DOCUMENTS

KR  101678842 B1  11/2016

OTHER PUBLICATIONS

Ragab, K., et al., "A 1.4 mW 8 b 350 MS/s loop-unrolled SAR ADC with background offset calibration in 40nm CMOS", IEEE ESSCIRC, 2016, pp. 417-420.
(Continued)

Primary Examiner — Lam T Mai
(74) Attorney, Agent, or Firm — Sughrue Mion, PLLC

(57) ABSTRACT

An analog-to-digital converter is provided. The analog-to-digital converter includes: a sample/hold circuit; a digital-to-analog converter; a plurality of comparison circuits; a control logic; and a digital register, wherein the plurality of comparison circuits include: a first comparison circuit configured to output a first comparison result signal in a first operation period; a second comparison circuit configured to, in a second operation period, calibrate an offset of a second comparison result signal based on a reference signal corresponding to the first comparison result signal among a plurality of reference signals and output the calibrated second comparison result signal; and a third comparison circuit configured to, in a third operation period, calibrate an offset of a third comparison result signal based on a reference signal corresponding to the calibrated second comparison result signal and output the calibrated third comparison result signal.

20 Claims, 18 Drawing Sheets

(56) References Cited

U.S. PATENT DOCUMENTS

| | | | | |
|---|---|---|---|---|
| 6,781,532 B2* | 8/2004 | Wei | ..................... | H03M 1/662 |
| | | | | 341/122 |
| 7,977,979 B2 | 7/2011 | Cho et al. | | |
| 8,188,902 B2 | 5/2012 | Mitikiri et al. | | |
| 8,723,706 B1* | 5/2014 | Shin | ................... | H03M 1/1019 |
| | | | | 341/161 |
| 8,730,074 B1* | 5/2014 | Cowley | ................ | H03M 1/183 |
| | | | | 341/122 |
| 8,749,415 B2 | 6/2014 | Jung et al. | | |
| 8,786,341 B1* | 7/2014 | Weltin-Wu | .......... | H03L 7/1075 |
| | | | | 327/159 |
| 9,295,123 B2* | 3/2016 | Williams | ............. | H05B 47/165 |
| 9,496,884 B1 | 11/2016 | Azenkot et al. | | |
| 10,230,386 B2 | 3/2019 | Ding et al. | | |
| 10,454,491 B1 | 10/2019 | Ghittori et al. | | |
| 10,469,096 B1 | 11/2019 | Ghittori et al. | | |
| 10,944,415 B2* | 3/2021 | Murphy | ................ | H03K 19/21 |
| 2005/0231412 A1* | 10/2005 | Confalonieri | ......... | H03M 1/002 |
| | | | | 341/155 |
| 2009/0244014 A1* | 10/2009 | Hotelling | .................. | G06F 3/05 |
| | | | | 345/173 |
| 2011/0080925 A1* | 4/2011 | Molina | ............... | H03M 1/0872 |
| | | | | 370/538 |
| 2012/0126781 A1* | 5/2012 | Narayanan | ..... | G01R 31/318516 |
| | | | | 324/76.11 |
| 2013/0127441 A1* | 5/2013 | Tseng | ............... | G01R 31/31924 |
| | | | | 324/76.11 |
| 2017/0179972 A1* | 6/2017 | Petilli | ................. | H03M 1/1245 |
| 2022/0077867 A1* | 3/2022 | An | ..................... | H03M 1/1061 |
| 2023/0061840 A1* | 3/2023 | Ang | ..................... | H04L 25/065 |

OTHER PUBLICATIONS

Kull, L., et al., "A 24-to-72 GS/s 8 b time-interleaved SAR ADC with 2.0-to-3.3pJ/conversion and > 30 dB SNDR at Nyquist in 14 nm CMOS FinFET," ISSCC Dig. Tech. Papers, 2018, pp. 358-359.

Liu, S., et al., "Analysis and Background Self-Calibration of Comparator Offset in Loop-Unrolled SAR ADCs," IEEE Trans. Circuits Syst. I, Reg. Papers, 2018, vol. 65, No. 2, pp. 458-470.

* cited by examiner

ANALOG-TO-DIGITAL CONVERTER

CROSS-REFERENCE TO RELATED APPLICATION

This application is based on and claims priority under 35 U.S.C. § 119 to Korean Patent Application No. 10-2021-0088569, filed on Jul. 6, 2021, in the Korean Intellectual Property Office, the disclosure of which is incorporated by reference herein in its entirety.

BACKGROUND

The present disclosure relates to an electronic apparatus, and more particularly, to an analog-to-digital converter.

Not only the speed of a digital logic circuit has been improved, but the power consumed by the digital logic circuit has also been drastically reduced, and thus, the competitiveness has been improved according to the development of a process. Accordingly, research into successive approximation register analog-to-digital converters operating based on digital circuits has been actively conducted. However, high-resolution successive approximation register analog-to-digital converters have performance limitations due to comparator noise and switch noise of digital-to-analog converters.

SUMMARY

One or more example embodiments provide an analog-to-digital converter capable of performing offset calibration only with comparison circuits without a separate reference comparison circuit for offset calibration.

According to an aspect of an example embodiment, there is provided an analog-to-digital converter including: a sample/hold circuit configured to sample a first input voltage and a second input voltage; a digital-to-analog converter configured to output a first comparison voltage and a second comparison voltage based on the sampled first input voltage and the sampled second input voltage; a plurality of comparison circuits configured to compare the first comparison voltage and the second comparison voltage to each other sequentially from a most significant bit to a least significant bit of a digital signal and output a plurality of comparison result signals; a control logic configured to control an operation of the plurality of comparison circuits, and generate a plurality of reference signals based on the plurality of comparison result signals output from the plurality of comparison circuits; and a digital register configured to output the digital signal based on the plurality of comparison result signals, wherein the plurality of comparison circuits include: a first comparison circuit configured to output a first comparison result signal in a first operation period; a second comparison circuit configured to, in a second operation period after the first operation period, calibrate an offset of a second comparison result signal based on a first reference signal corresponding to the first comparison result signal from among the plurality of reference signals and output the calibrated second comparison result signal; and a third comparison circuit configured to, in a third operation period after the second operation period, calibrate an offset of a third comparison result signal based on a second reference signal corresponding to the calibrated second comparison result signal from among the plurality of reference signals and output the calibrated third comparison result signal.

According to an aspect of an example embodiment, there is provided an analog-to-digital converter including: a signal generator configured to generate a sample signal and a flag signal based on an external clock signal; a sample/hold circuit configured to sample a first input voltage and a second input voltage in response to the sample signal; a digital-to-analog converter configured to output a first comparison voltage and a second comparison voltage based on the sampled first input voltage and the sampled second input voltage; a first comparison circuit to an Nth comparison circuits configured to output, sequentially from an Nth bit to first bit of a digital signal, first to Nth comparison result signals indicating a result of comparison between the first comparison voltage and the second comparison voltage, and first to Nth comparison completion signals indicating that a comparison operation is completed, N being a natural number greater than or equal to 2; a control logic configured to output, to the first to Nth comparison circuits, first to Nth reference signals, first to Nth enable signals, and first to Nth selection signals based on the first to Nth comparison result signals; and a digital register configured to output the digital signal based on the first to Nth comparison result signals, wherein each of the first to Nth comparison circuits, associated with a corresponding reference signal, includes: a comparator configured to receive the first comparison voltage and the second comparison voltage, a first offset voltage and a second offset voltage, compare the first comparison voltage and the second comparison voltage to each other in response to a first clock signal, and output a comparison result signal; a data latch configured to latch the comparison result signal, and output a comparison completion signal in response to an enable signal; an offset calibration logic configured to control the first offset voltage and the second offset voltage based on the corresponding reference signal and the comparison result signal in response to the flag signal; a selector configured to output a second comparison completion signal selected according to a selection signal from among the first to Nth comparison completion signals; an operation gate configured to perform an AND operation on the enable signal and the selected comparison completion signal and output an operation result signal; and a clock generator configured to generate a second clock signal in response to the operation result signal and be reset in response to the comparison completion signal.

According to an aspect of an example embodiment, there is provided an analog-to-digital converter including: a signal generator configured to generate a sample signal, a reset signal, and a flag signal based on an external clock signal; a sample/hold circuit configured to sample a first input voltage and a second input voltage in response to the sample signal; a digital-to-analog converter configured to output a first comparison voltage and a second comparison voltage based on the sampled first input voltage and the sampled second input voltage; first to Nth comparison circuits configured to output, sequentially from an Nth bit to first bit of a digital signal, first to Nth comparison result signals indicating a result of comparison between the first comparison voltage and the second comparison voltage, and first to Nth comparison completion signals indicating that a comparison operation is completed, N being a natural number greater than or equal to 2; a control logic configured to output, to the first to Nth comparison circuits, first to Nth reference signals, first to Nth enable signals, and first to Nth selection signals based on the first to Nth comparison result signals; and a digital register configured to output the digital signal based on the first to Nth comparison result signals, wherein each of the first to Nth comparison circuits, associated with a corresponding reference signal, includes: a comparator configured to receive the first comparison voltage, the second comparison voltage, a first offset voltage, and a second offset voltage, compare the first comparison voltage and the second comparison voltage to each other in response to a first clock signal, and output a comparison result signal; a data latch configured to latch the comparison result signal, and output a comparison completion signal in response to an enable signal; an offset calibration logic configured to control the first offset voltage and the second offset voltage based on the corresponding reference signal and the comparison result signal in response to the flag signal; a selector configured to output a second comparison completion signal selected according to a selection signal from among the first to Nth comparison completion signals; a first operation gate configured to perform an AND operation on the enable signal and the selected comparison completion signal and output a first operation result signal; a second operation gate configured to perform an AND operation on the enable signal and the comparison completion signal and output a second operation result signal; and a clock generator configured to generate a second clock signal in response to the first operation result signal and the second operation result signal, and be reset in response to the reset signal.

BRIEF DESCRIPTION OF THE DRAWINGS

Example embodiments of the disclosure will be more clearly understood from the following detailed description taken in conjunction with the accompanying drawings in which.

DETAILED DESCRIPTION

Figure 1:
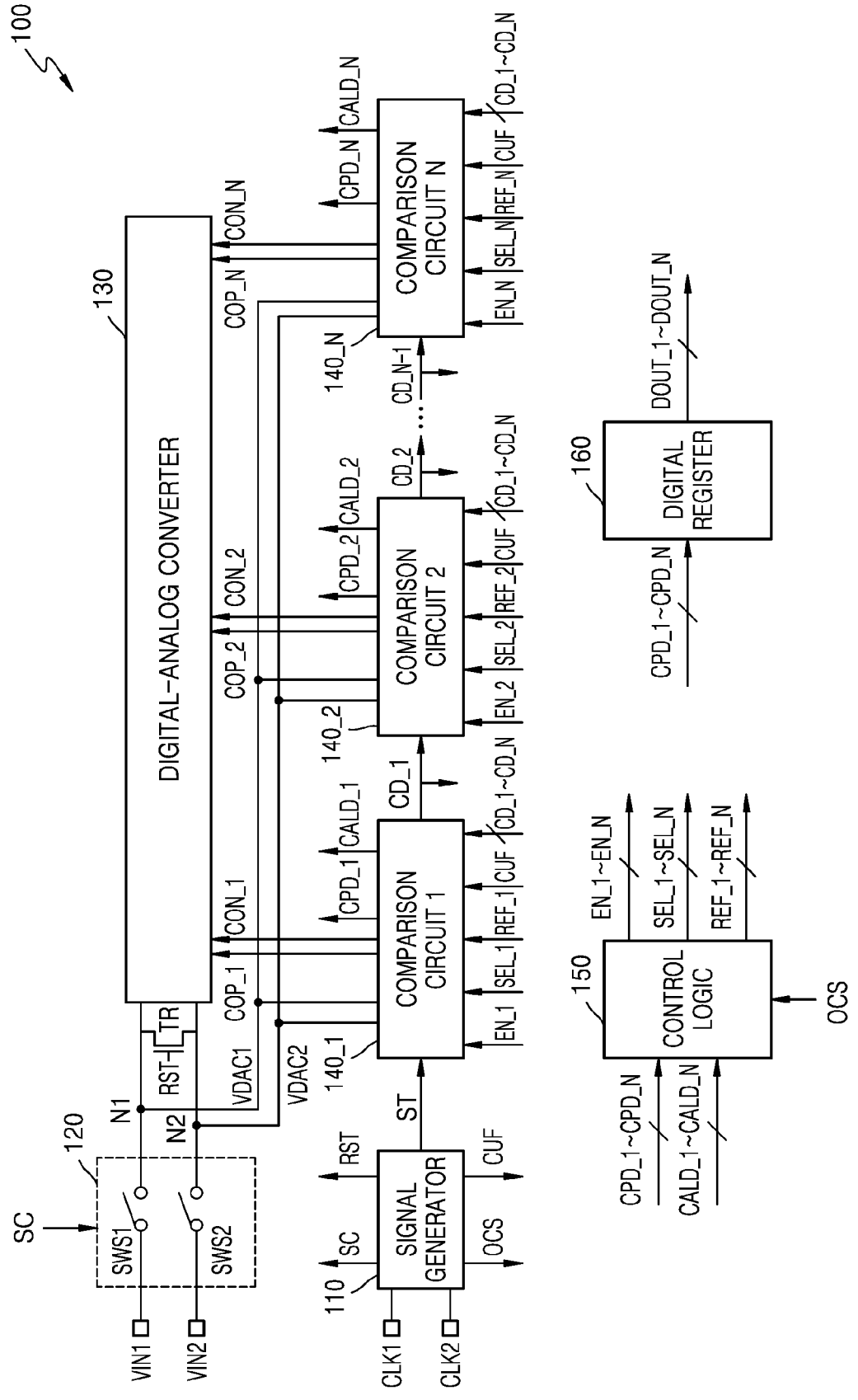
FIG. 1 is a diagram of an analog-to-digital converter according to an example embodiment of the disclosure.

Hereinafter, example embodiments of the disclosure will be described in detail with reference to the accompanying drawings. The example embodiments of the disclosure are provided to more completely explain the disclosure to a person of ordinary skill in the art. The disclosure may, however, be embodied in many different forms and should not be construed as being limited to the example embodiments set forth herein. However, this is not intended to limit the disclosure to a specific form of disclosure, and it should be understood to include all modifications, equivalents and substitutes included in the spirit and scope of the disclosure. In describing each figure, like reference numerals are used for like elements. In the accompanying drawings, the dimensions of the structures are enlarged or reduced than the actual size for clarity of the disclosure.

FIG. 1 is a diagram of an analog-to-digital converter 100 according to an example embodiment of the disclosure.

Referring to FIG. 1, the analog-to-digital converter 100 according to an example embodiment of the disclosure may convert an analog signal into a digital signal. In an embodiment, the analog-to-digital converter 100 may include a successive approximation register analog-to-digital converter.

The analog signal may include a signal representing specific information. An "analog signal" described herein may be referred to as an "input voltage". The analog signal may be implemented as a differential signal. For example, the analog signal may be implemented as a signal corresponding to a voltage difference between a first input voltage VIN1 and a second input voltage VIN2. The first input voltage VIN1 and the second input voltage VIN2 may be received via differential channels of the analog-to-digital converter 100. In an example embodiment, the first input voltage VIN1 may be greater than the second input voltage VIN2. For example, the first input voltage VIN1 may include a positive voltage greater than 0, and the second input voltage VIN2 may include a negative voltage less than 0. However, the disclosure is not limited thereto.

The digital signal may include a signal having a bit value of N bits. N may be a natural number. In an example embodiment, first to $N^{th}$ digital signals DOUT_1 to DOUT_N may be signals each having bit values of a most significant bit (or MSB) to a least significant bit (or LSB). For example, the first digital signal DOUT_1 may include a signal having a bit value of the MSB, the second digital signal DOUT_2 may include a signal having a bit value of the MSB−1, and the $N^{th}$ digital signal DOUT_N may include a signal having a bit value of the LSB. However, the disclosure is not limited thereto. A "digital signal" described herein may be referred to as a "digital code".

The analog-to-digital converter 100 may receive a reference voltage from the outside so as to convert the first and second input voltages VIN1 and VIN2 into the first to $N^{th}$ digital signals DOUT_1 to DOUT_N. In one operation period, the analog-to-digital converter 100 may sample the first and second input voltages VIN1 and VIN2, determine bit values sequentially from the most significant bit to the least significant bit of a digital signal, and determine a digital signal close to the first and second input voltages VIN1 and VIN2. Thus, an operation period corresponds to a conversion cycle of the analog-to-digital converter 100. In one operation period, the analog-to-digital converter 100 may convert the first and second input voltages VIN1 and VIN2 into the first to Nth digital signals DOUT_1 to DOUT_N through a plurality of successive approximation cycles. The analog-to-digital converter 100 may determine an output logic value corresponding to one bit of the digital signal every one successive approximation cycle. The analog-to-digital converter 100 may repeatedly perform, for each operation period, an operation of sampling the first and second input voltages VIN1 and VIN2, determining bit values of the digital signal, and outputting the digital signal.

The analog-to-digital converter 100 may include a signal generator 110, a sample/hold circuit 120, a digital-to-analog converter 130, first to $N^{th}$ comparison circuits 140_1 to 140_N, a control logic 150, and a digital register 160.

The signal generator 110 may generate a sample/hold control signal SC, a reset signal RST, a start signal ST, a calibration control signal OCS, and a flag signal CUF based on a first external clock signal CLK1 and a second external clock signal CLK2. The sample/hold control signal SC may include a signal for controlling operations of the sample/hold circuit 120. The reset signal RST may include a signal for controlling operations of a reset transistor TR. The start signal ST may include a signal for initiating an operation of a comparison circuit corresponding to the MSB, for example, the first comparison circuit 140_1, from among the first to Nth comparison circuits 140_1 to 140_N. The calibration control signal OCS may include a signal for initiating operations of the control logic 150. The flag signal CUF may include a signal for controlling an offset calibration operation of the first to Nth comparison circuits 140_1 to 140_N.

The sample/hold circuit 120 may sample the first and second input voltages VIN1 and VIN2 in response to the sample/hold control signal SC and transfer, to the digital-to-analog converter 130, the first and second input voltages VIN1 and VIN2 that are sampled. The first input voltage VIN1 may be applied to a first node N1, and the second input voltage VIN2 may be applied to a second node N2. In an example embodiment, the sample/hold circuit 120 may include a first switch SWS1 and a second switch SWS2.

In response to first to $N^{th}$ positive signals COP_1 to COP_N and first to $N^{th}$ negative signals CON_1 to CON N, the digital-to-analog converter 130 may generate first and second comparison voltages VDAC1 and VDAC2 for generating the first to $N^{th}$ digital signals DOUT_1 to DOUT_N based on the first and second input voltages VIN1 and VIN2 that are sampled. A comparison voltage may have a voltage level obtained by adding or subtracting a voltage level of a reference voltage to or from a voltage level of a sampling voltage VIN. In an example embodiment, the first comparison voltage VDAC1 may be greater than the second comparison voltage VDAC2. For example, the first comparison voltage VDAC1 may be a positive voltage, and the second comparison voltage VDAC2 may be a negative voltage. However, the disclosure is not limited thereto. A positive signal and a negative signal may have opposite logic levels. For example, when the first positive signal COP_1 has a logic high level, the first negative signal CON_1 may have a logic low level.

The reset transistor TR may electrically connect the first node N1 and the second node N2 to each other in response to the reset signal RST.

The first to $N^{th}$ comparison circuits 140_1 to 140_N may perform an operation of comparing the first and second comparison voltages VDAC1 and VDAC2 to each other, sequentially from the most significant bit to the least significant bit of the digital signal. In addition, each of the comparison circuits may generate a comparison result signal and a comparison completion signal. Because the analog-to-digital converter 100 includes the first to $N^{th}$ comparison circuits 140_1 to 140_N, there is an advantage in that a loss in a switching period is reduced, compared to when the analog-to-digital converter 100 includes a single comparison circuit.

The comparison result signal may include a signal indicating a result of comparing the first and second comparison voltages VDAC1 and VDAC2 to each other. For example, when the first comparison voltage VDAC1 is greater than the second comparison voltage VDAC2, the comparison result signal may have a first logic level. When the first comparison voltage VDAC1 is less than the second comparison voltage VDAC2, the comparison result signal may have a second logic level that is different from the first logic level. In an example embodiment, the first logic level may be a logic low level, and the second logic level may be a logic high level. However, the disclosure is not limited thereto, and a case opposite to the above-described example may also be applied to the present example embodiment. In an example embodiment, the first to $N^{th}$ comparison circuits 140_1 to 140_N may output first to $N^{th}$ comparison result signals, respectively.

A comparison result signal may include a comparison data signal and a calibration signal. The comparison data signal may include a signal for generating a bit value of each digital signal. For example, a first comparison data signal CPD_1 may be a signal for generating a bit value of the first digital signal DOUT_1, a second comparison data signal CPD_2 may be a signal for generating a bit value of the second digital signal DOUT_2, and an $N^{th}$ comparison data signal CPD_N may be a signal for generating a bit value of the $N^{th}$ digital signal DOUT_N. However, the disclosure is not limited thereto. The calibration signal may include a signal for calibrating an offset of the comparison data signal. For example, a first calibration signal CALD_1 may be a signal for calibrating an offset of the first comparison data signal CPD_1, a second calibration signal CALD_2 may be a signal for calibrating an offset of the second comparison data signal CPD_2, and an $N^{th}$ calibration signal CALD_N may be a signal for calibrating an offset of the $N^{th}$ comparison data signal CPD_N. However, the disclosure is not limited thereto. In an example embodiment, a logic level of the comparison data signal may be the same as that of the calibration signal. However, the disclosure is not limited thereto.

The comparison completion signal may include a signal indicating that a comparison operation is completed by each comparison circuit. For example, when the comparison operation is completed, the comparison completion signal may be a pulse wave having a constant logic level. An $i^{th}$ comparison circuit may perform a comparison operation in response to a comparison completion signal of an $i-1^{st}$ comparison circuit. i may be a natural number of 2 or more. For example, the second comparison circuit 140_2 may perform a comparison operation in response to a first comparison completion signal CD_1 of the first comparison circuit 140_1.

In an example embodiment, in response to a flag signal CUF, each comparison circuit may perform an offset calibration operation based on a reference signal. The offset calibration operation may include an operation in which a comparison circuit calibrates an offset of a comparison result signal, for example, a comparison data signal. The reference signal may include a signal that serves as a reference for determining whether to calibrate the offset of the comparison data signal. For example, in response to the flag signal CUF, the first comparison circuit 140_1 may calibrate an offset of the first comparison data signal CPD_1 based on a first reference signal REF_1.

In an example embodiment, each comparison circuit may receive an enable signal, a selection signal, and first to $N^{th}$ comparison completion signals CD_1 to CD_N. The enable signal may include a signal for controlling a comparison circuit to perform a plurality of comparison operations in one operation period. Alternatively, the enable signal may include a signal for controlling an output of the comparison completion signal. For example, a first enable signal EN_1 may be input to the first comparison circuit 140_1. The selection signal may include a signal for selecting any of the first to $N^{th}$ comparison completion signals CD_1 to CD_N. For example, a first selection signal SEL_1 may be input to the first comparison circuit 140_1.

The control logic 150 may control overall operations of the analog-to-digital converter 100. In an example embodiment, the control logic 150 may generate first to $N^{th}$ enable signals EN_1 to EN_N, first to $N^{th}$ selection signals SEL_1 to SEL_N, and first to $N^{th}$ reference signals REF_1 to REF_N based on the first to $N^{th}$ comparison data signals CPD_1 to CPD_N and the first to $N^{th}$ calibration signals CALD_1 to CALD_N.

The control logic 150 may include a digital error correction circuit that corrects errors of the first to $N^{th}$ digital signals DOUT_1 to DOUT_N.

The digital register 160 may receive the first to $N^{th}$ comparison data signals CPD_1 to CPD_N and output the first to Nth digital signals DOUT_1 to DOUT_N. According to example embodiments, the digital register 160 may be included in the control logic 150.

Figure 2:
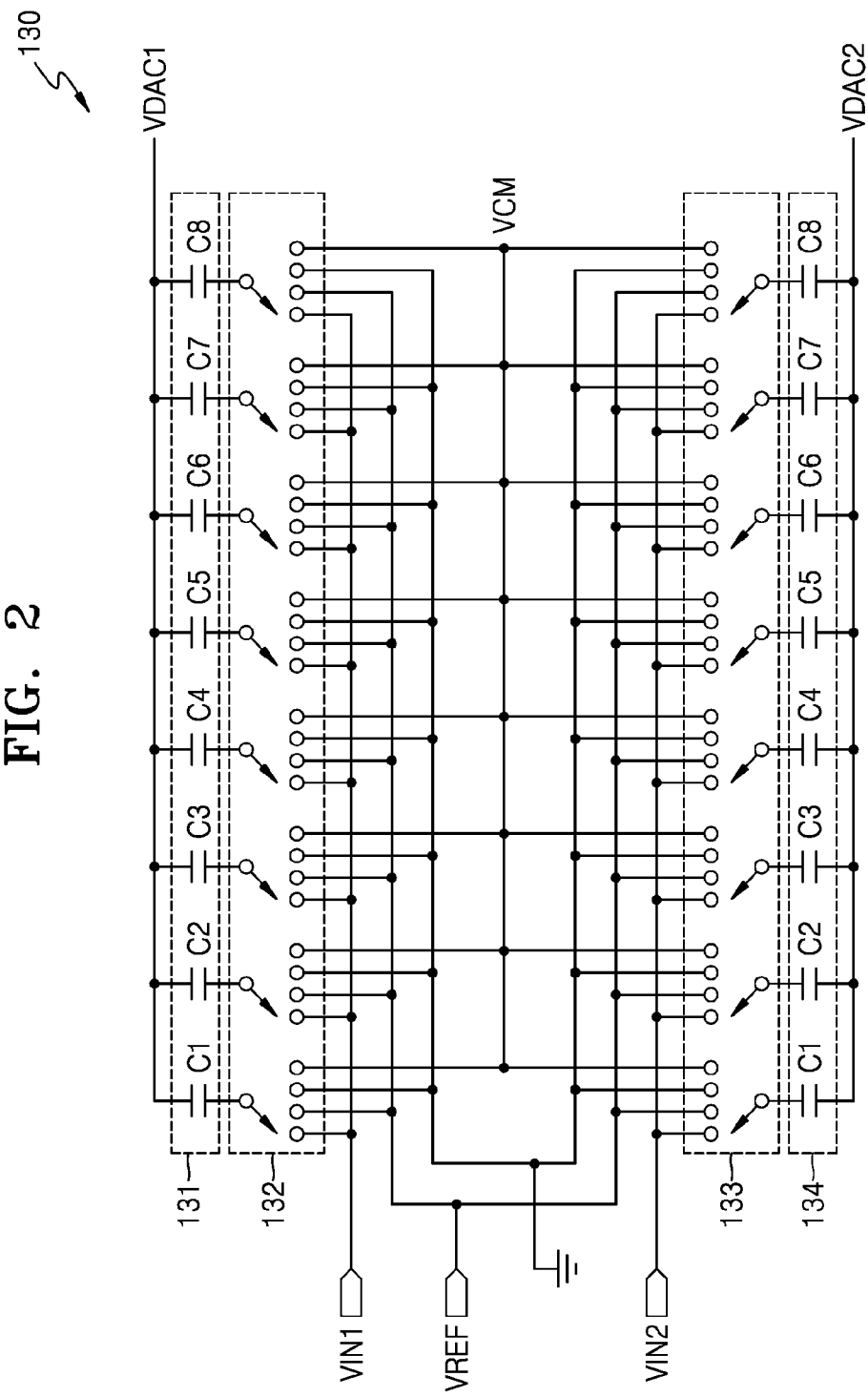
FIG. 2 is a diagram of a digital-to-analog converter according to an example embodiment of the disclosure.

FIG. 2 is a diagram of a digital-to-analog converter 130 according to an example embodiment of the disclosure.

Referring to FIG. 2, the digital-to-analog converter 130 may include a first capacitor array 131, a first switch circuit 132, a second switch circuit 133, and a second capacitor array 134.

The first capacitor array 131 may include a plurality of capacitors. The number of capacitors included in the first capacitor array 131 may be determined according to a resolution of the analog-to-digital converter 100 or the number of bits of a digital signal Dout. For example, when the analog-to-digital converter 100 has a resolution of 8 bits, the number of capacitors included in the first capacitor array 131 may be eight capacitors, for example, first to eighth capacitors C1 to C8. However, the disclosure is not limited thereto.

First terminals of the first to eighth capacitors C1 to C8 may be connected to nodes to which the first comparison voltage VDAC1 is applied. Second terminals of the first to eighth capacitors C1 to C8 may be electrically connected to the first switch circuit 132.

The first to seventh capacitors C1 to C7 included in the first capacitor array 131 may have different capacitances so as to differentially distribute charges. In other words, a capacitance of a specific capacitor corresponding to a specific bit of the digital signal Dout may be twice a capacitance of a capacitor corresponding to a lower bit adjacent to the corresponding bit. For example, a capacitance of the first capacitor C1 may be twice a capacitance of the second capacitor C2, and the capacitance of the second capacitor C2 may be twice a capacitance of the third capacitor C3. In addition, a capacitance of the eighth capacitor C8 may be equal to a capacitance of the seventh capacitor C7.

In response to each of positive signals (for example, the first to $N^{th}$ positive signals COP_1 to COP_N) output from each comparison circuit, the first switch circuit 132 may selectively connect one of the first input voltage VIN1, a reference voltage VREF, a ground voltage, and a common voltage VCM to each of the capacitors included in the first capacitor array 131. For example, when the analog-to-digital converter 100 has a resolution of 8 bits, the analog-to-digital converter 100 may include first to eighth comparison circuits, and the first switch circuit 132 may connect any of the first input voltage VIN1, the reference voltage VREF, the ground voltage, and the common voltage VCM to the first capacitor C1, in response to the first positive signal COP_1. However, the disclosure is not limited thereto.

The second switch circuit 133 may be connected to the second capacitor array 134. In response to each of negative control signals (for example, the first to $N^{th}$ negative control signals CON_1 to CON_N) output from each comparison circuit, the second switch circuit 133 may selectively connect any of the second input voltage VIN2, the reference voltage VREF, the ground voltage, and the common voltage VCM to each of capacitors included in the second capacitor array 134.

The second capacitor array 134 may include the same number of capacitors as the first capacitor array 131. For example, when the first capacitor array 131 includes the first to eighth capacitors C1 to C8, the second capacitor array 134 may also include first to eighth capacitors C1 to C8. First terminals of the first to eighth capacitors C1 to C8 included in the second capacitor array 134 may be connected to nodes to which the second comparison voltage VDAC2 is applied. Second terminals of the first to eighth capacitors C1 to C8 included in the second capacitor array 134 may be electrically connected to the second switch circuit 133.

Figure 3A:
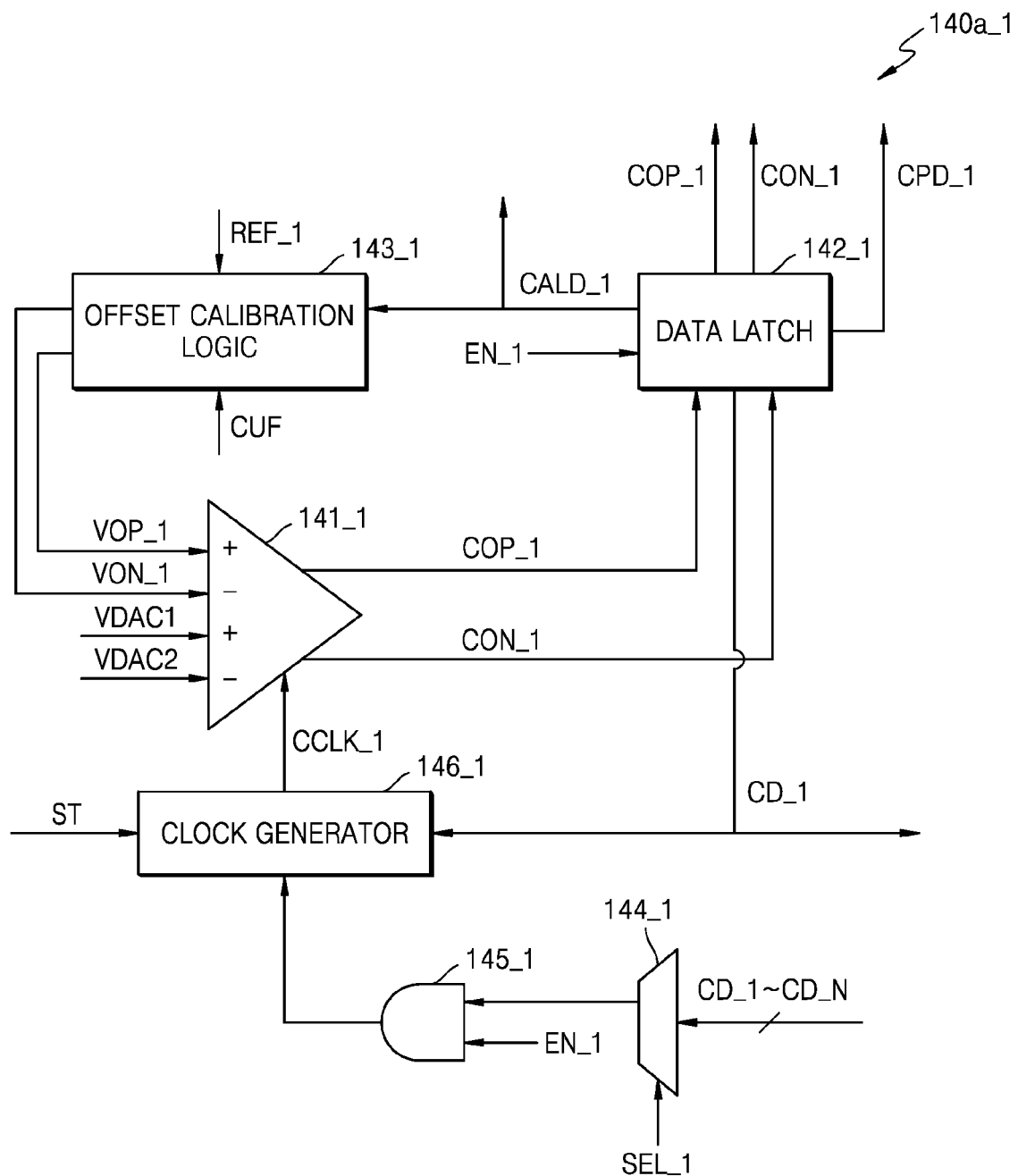
FIGS. 3A and 3B are diagrams of an example of a comparison circuit.
Figure 3B:
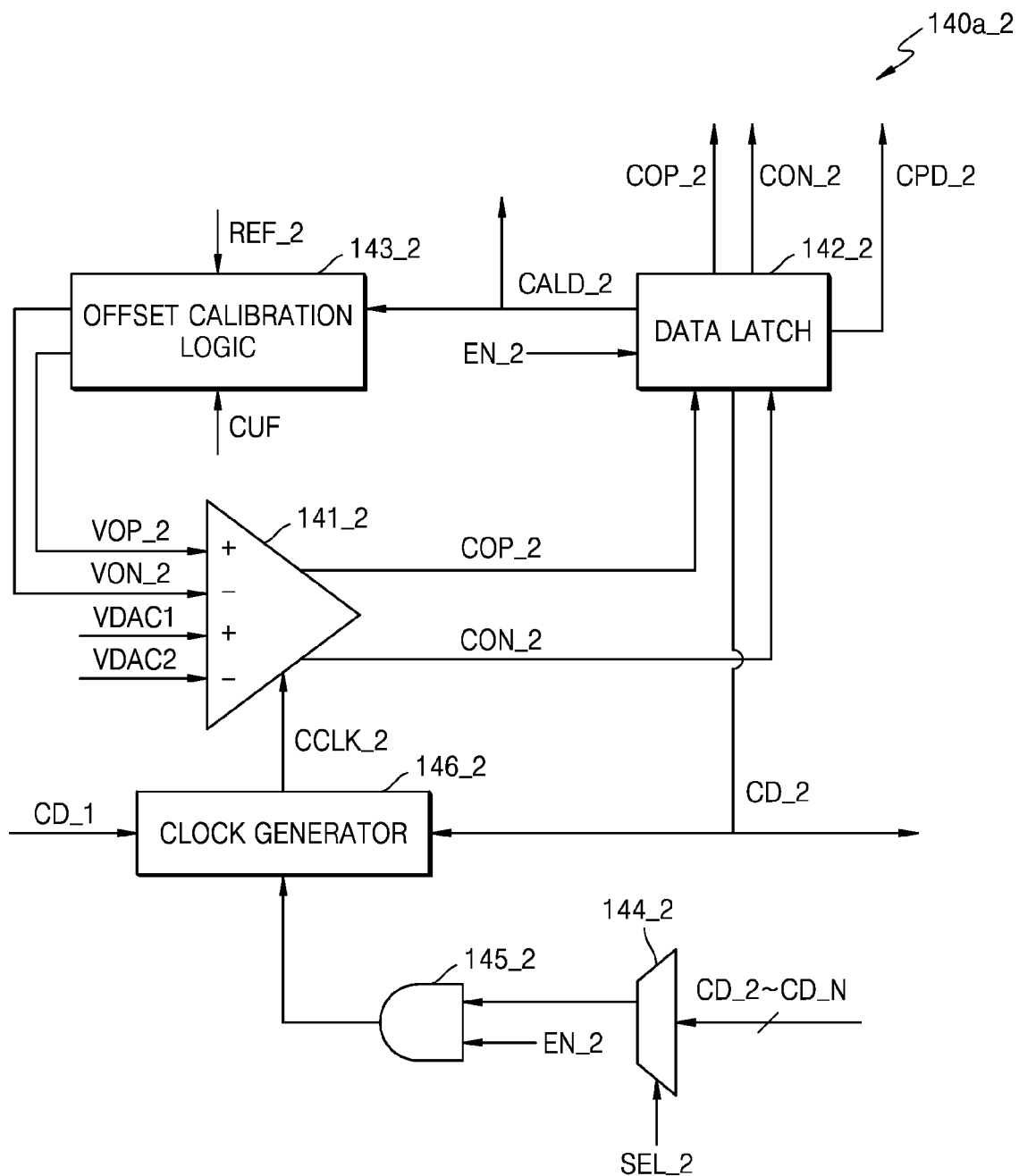

FIGS. 3A and 3B are diagrams of an example of a comparison circuit. For example, FIG. 3A is a diagram illustrating a first comparison circuit 140a_1, and FIG. 3B is a diagram illustrating a second comparison circuit 140a_2.

Referring to FIG. 3A, the first comparison circuit 140a_1 may include a comparator 141_1, a data latch 142_1, an offset calibration logic 143_1, a selector 144_1, an operation gate 145_1, and a clock generator 146_1.

The comparator 141_1 may compare first and second comparison voltages VDAC1 and VDAC2 to each other in response to a first clock signal CCLK_1 and output a first positive signal COP_1 and a first negative signal CON_1. For example, when the first comparison voltage VDAC1 is greater than the second comparison voltage VDAC2, the comparator 141_1 may output the first positive signal COP_1 having a second logic level that is greater than the first logic level and output the first negative signal CON_1 having the first logic level. In another example, when the first comparison voltage VDAC1 is less than the second comparison voltage VDAC2, the comparator 141_1 may output the first positive signal COP_1 having the first logic level and output the first negative signal CON_1 having the second logic level. However, the disclosure is not limited thereto.

The comparator 141_1 may further receive a first positive offset voltage VOP_1 and a first negative offset voltage VON_1. In an example embodiment, a positive offset voltage and a negative offset voltage may be changed to be opposite to each other. For example, when the positive offset voltage increases, the negative offset voltage may decrease, and when the positive offset voltage decreases, the negative offset voltage may increase. In this case, a change amount of the positive offset voltage may be the same as a change amount of the negative offset voltage. The comparator 141_1 may adjust an offset of each of the first positive signal COP_1 and the first negative signal CON_1, in response to the first positive offset voltage VOP_1 and the first negative offset voltage VON_1.

The data latch 142_1 may receive the first positive signal COP_1 and the first negative signal CON_1, latch the first positive signal COP_1 and the first negative signal CON_1, and output the first positive signal COP_1 and the first negative signal CON_1, which are latched, to the digital-to-analog converter 130. In general, the digital-to-analog converter 130 is driven with analog voltages to cause differential charge distribution on the capacitors of FIG. 2. Thus, in some embodiments, the data latch 142_1 drives analog voltages to the digital-to-analog converter 130 to cause the differential charge distribution. The data latch 142_1 alternatively drives COP_1 and CON_1 on to the VREF input terminal of the digital-to-analog converter 130. The use of a capacitive analog to digital circuit converter such as digital-to-analog converter 130 in a successive approximation register analog to digital converter (SAR-ADC) is well known.

The data latch 142_1 may output a first comparison completion signal CD_1, a first comparison data signal CPD_1, and a first calibration signal CALD_1 based on the first positive signal COP_1 and the first negative signal CON_1, which are latched. The first comparison completion signal CD_1 may be provided to the clock generator 146_1 and the second to $N^{th}$ comparison circuits 140_2 to 140_N. The first comparison data signal CPD_1 may be provided to the control logic 150 and the digital register 160. The first calibration signal CALD_1 may be provided to the offset calibration logic 1431 and the control logic 150.

In an example embodiment, the data latch 142_1 may generate the first comparison completion signal CD_1, in response to a first enable signal EN_1. For example, when the first enable signal EN_1 has a first logic level, the data latch 142_1 may generate the first comparison completion signal CD_1 every time the first positive signal COP_1 and the first negative signal CON_1 are received. In another example, when the first enable signal EN_1 has a second logic level, the data latch 142_1 may generate the first comparison completion signal CD_1 only when the first positive signal COP_1 and the first negative signal CON_1 are initially received in one operation period.

The offset calibration logic 143_1 may control a first positive offset voltage VOP_1 and a first negative offset voltage VON_1 based on a first reference signal REF_1 and the first calibration signal CALD_1. For example, when the first reference signal REF_1 and the first calibration signal CALD_1 have the same logic level, the offset calibration logic 143_1 may maintain the first positive offset voltage VOP_1 and the first negative offset voltage VON_1. In another example, when the first reference signal REF_1 and the first calibration signal CALD_1 have different logic levels from each other, the offset calibration logic 143_1 may increase the first positive offset voltage VOP_1 while reducing the first negative offset voltage VON_1 or may reduce the first positive offset voltage VOP_1 while increasing the first negative offset voltage VON_1. For example, when the first reference signal REF_1 has a first logic level and the first calibration signal CALD_1 has a second logic level that is greater than the first logic level, an offset of the first comparison data signal CPD_1 may have a relatively large value. Thus, the offset calibration logic 143_1 may reduce the offset of the first comparison data signal CPD_1 by increasing the first negative offset voltage VON_1 while reducing the first positive offset voltage VOP_1. When the first reference signal REF_1 has a second logic level and the first reference signal REF_1 has a first logic level, the offset of the first comparison data signal CPD_1 may have a relatively small value. Thus, the offset calibration logic 143_1 may increase the offset of the first comparison data signal CPD_1 by reducing the first negative offset voltage VON_1 while increasing the first positive offset voltage VOP_1. The first reference signal REF_1 may include a signal generated by the control logic 150 based on the first to $N^{th}$ comparison data signals CPD_1 to CPD_N or the first to $N^{th}$ calibration signals CALD_1 to CALD_N.

In an example embodiment, because a calibration signal may have the same logic level as a comparison data signal, the offset calibration logic 143_1 may also control the first positive offset voltage VOP_1 and the first negative offset voltage VON_1 based on the first reference signal REF_1 and the first comparison data signal CPD_1.

The selector 144_1 may output a comparison completion signal selected according to the first selection signal SEL_1 from among first to $N^{th}$ comparison completion signals CD_1 to CD_N. For example, when the first selection signal SEL_1 refers to a fifth comparison completion signal of a fifth comparison circuit, the selected comparison completion signal is a fifth comparison completion signal, and the selector 144_1 may output the fifth comparison completion signal to the operation gate 145_1.

The operation gate 145_1 may perform an AND operation on the selected comparison completion signal and the first enable signal EN_1 and output an operation result signal to the clock generator 146_1.

The clock generator 146_1 may output the first clock signal CCLK_1 to the clock generator 146_1 in response to the start signal ST. Alternatively, the clock generator 1461 may output a first clock signal CCLK_1 to the comparator 1411, in response to the operation result signal. The clock generator 146_1 may be reset in response to the first comparison completion signal CD_1.

Referring to FIG. 3B, the second comparison circuit 140a_2, similar to the first comparison circuit 140a_1, may include a comparator 141_2, a data latch 142_2, an offset calibration logic 143_2, a selector 144_2, an operation gate 145_2, and a clock generator 146_2.

The comparator 141_2 may receive a second positive offset voltage VOP_2, a second negative offset voltage VON_2, and the first and second comparison voltages VDAC1 and VDAC2. The comparator 141_2 may output a second positive signal COP_2 and a second negative signal CON_2.

The data latch 142_2 may latch the second positive signal COP_2 and the second negative signal CON_2 and transfer the second positive signal COP_2 and the second negative signal CON_2, which are latched, to the digital-to-analog converter 130. The data latch 142_2 may output a second calibration signal CALD_2 and a second comparison data signal CPD_2 based on the second positive signal COP_2 and the second negative signal CON_2 that are latched. In an example embodiment, the data latch 1422, while a second enable signal EN_2 has a specific logic level (for example, a second logic level), may output a second comparison completion signal CD_2 only when the second positive signal COP_2 and the second negative signal CON_2 are initially received.

The offset calibration logic 143_2 may control the second positive offset voltage VOP_2 and the second negative offset voltage VON_2 based on a second reference signal REF_2 and the second calibration signal CALD_2 (or the second comparison data signal CPD_2). The second reference signal REF_2 may be a signal generated by the control logic 150 based on the first to $N^{th}$ comparison data signals CPD_1 to CPD_N or the first to $N^{th}$ calibration signals CALD_1 to CALD_N.

The selector 144_2 may output a comparison completion signal selected according to a second selection signal SEL_2 from among first to $N^{th}$ comparison completion signals CD_1 to CD_N.

The operation gate 145_2 may perform an AND operation on the selected comparison completion signal and the second enable signal EN_2 and output an operation result signal to the clock generator 146_2.

The clock generator 146_2 may output a second clock signal CCLK_2, in response to the first comparison completion signal CD_1 and the operation result signal. The clock generator 146_2 may be reset in response to the second comparison completion signal CD_2.

The third to $N^{th}$ comparison circuits 140_3 to 140_N are similar to the above, and descriptions thereof are omitted.

Figure 4:
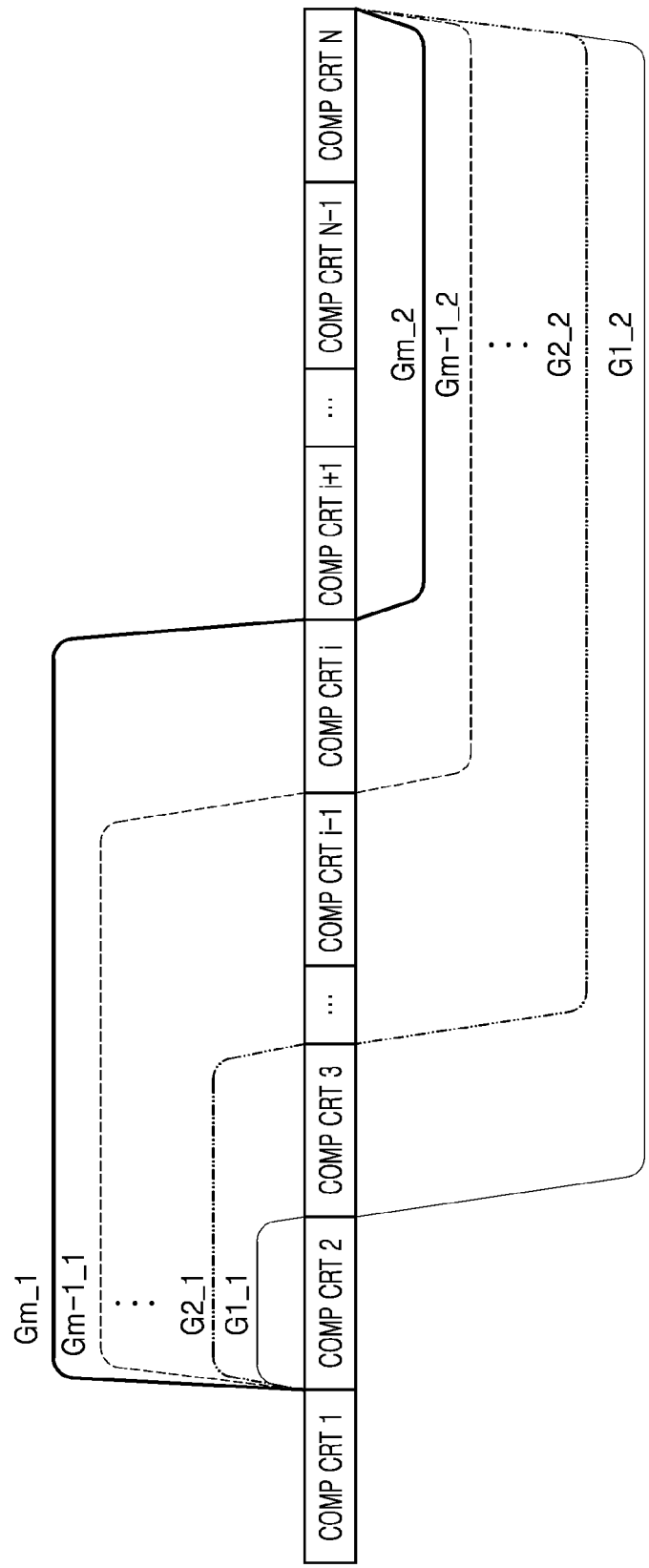
FIG. 4 is a diagram provided to describe a method of grouping first to $N^{th}$ comparison circuits, according to an example embodiment of the disclosure.

FIG. 4 is a diagram provided to describe a method of grouping first to $N^{th}$ comparison circuits, according to an example embodiment of the disclosure.

Referring to FIG. 4, any one comparison circuit from among first to $N^{th}$ comparison circuits COMP CRT 1 to COMP CRT N may be a reference comparison circuit. Referring to FIG. 4, for example, the first comparison circuit COMP CRT 1 may be a reference comparison circuit. However, the disclosure is not limited thereto. Hereinafter, it is assumed that the first comparison circuit COMP CRT 1 is a reference comparison circuit.

In an example embodiment, at least one of the second to $N^{th}$ comparison circuits COMP CRT 2 to COMP CRT N may be included in a first group, and the remaining circuits from among the second to $N^{th}$ comparison circuits COMP CRT 2 to COMP CRT N except for the first group may be included in a second group.

Referring to FIG. 4, for example, the second comparison circuit COMP CRT 2 may be included in a first group G1_1, and the third to $N^{th}$ comparison circuits COMP CRT 3 to COMP CRT N may be included in a second group G1_2.

Referring to FIG. 4, in another example, the second and third comparison circuits COMP CRT 2 and COMP CRT 3 may be included in a first group G2_1, and the fourth to $N^{th}$ comparison circuits COMP CRT 4 to COMP CRT N may be included in a second group G2_2.

Referring to FIG. 4, in another example, second to $i-1^{st}$ comparison circuits COMP CRT 2 to COMP CRT i-1 may be included in a first group Gm-1_1, and $i^{th}$ to $N^{th}$ comparison circuits COMP CRT i to COMP CRT N may be included in a second group Gm-1_2.

Referring to FIG. 4, in another example, the second to $i^{th}$ comparison circuits COMP CRT 2 to COMP CRT i may be included in a first group Gm_1, and $i+1^{st}$ to $N^{th}$ comparison circuits COMP CRT i+1 to COMP CRT N may be included in a second group Gm_2.

Here, i may be a natural number less than N. Specifically, 2i may be a natural number less than or equal to N+1. In other words, the number of comparison circuits included in the first group may be less than or equal to the number of comparison circuits included in the second group. m may be i-1.

In an example embodiment, a comparison circuit included in the first group may perform an offset calibration operation based on each of the comparison circuits included in the second group.

Referring to FIG. 4, for example, the second comparison circuit COMP CRT 2 included in the first group G1_1 may perform an offset calibration operation based on any calibration signal from among the third to $N^{th}$ comparison circuits COMP CRT 3 to COMP CRT N included in the second group G1_2. The second comparison circuit COMP CRT 2 included in the first group G1_1 may perform an offset calibration operation based on a calibration signal of the $N^{th}$ comparison circuit COMP CRT N included in the second group G1_2. This is because an offset may be more easily detected as bits from the most significant bit to the least significant bit of a data signal are determined.

Referring to FIG. 4, in another example, the second comparison circuit COMP CRT 2 included in the first group G2_1 may perform an offset calibration operation based on a calibration signal of the $N-1^{st}$ comparison circuit COMP CRT N-1 included in the second group G2_2. The third comparison circuit COMP CRT 3 included in the first group G2_1 may perform an offset calibration operation based on a calibration signal of the $N^{th}$ comparison circuit COMP CRT N included in the second group G2_2. However, the disclosure is not limited thereto.

Referring to FIG. 4, in another example, the $i-1^{st}$ comparison circuit COMP CRT i-1 included in the first group Gm_1 may perform an offset calibration operation based on a calibration signal of the $N^{th}$ comparison circuit COMP CRT N included in the second group Gm_2. The $i-2^{nd}$ comparison circuit to the second comparison circuit COMP CRT 2 included in the first group Gm_1 may perform an offset calibration operation based on a calibration signal of each of the $N-1^{st}$ comparison circuit COMP CRT N-1 to the $i^{th}$ comparison circuit COMP CRT i. However, the disclosure is not limited thereto.

Referring to FIG. 4, in another example, the $i-1^{st}$ comparison circuit COMP CRT i-1 included in the first group Gm_1 may perform an offset calibration operation based on a calibration signal of the $N-1^{st}$ comparison circuit COMP CRT N-1 included in the second group Gm_2. The $i^{th}$ comparison circuit COMP CRT i included in the first group Gm_1 may perform an offset calibration operation based on a calibration signal of the $N^{th}$ comparison circuit COMP CRT N included in the second group Gm_2. The $i-2^{nd}$ comparison circuit to the second comparison circuit COMP CRT 2 included in the first group Gm_1 may perform an offset calibration operation based on a calibration signal of each of an $N-2^{nd}$ comparison circuit to the $i+1^{st}$ comparison circuit COMP CRT i+1. However, the disclosure is not limited thereto.

In an example embodiment, a comparison circuit included in the second group may perform an offset calibration operation based on a calibration signal from among comparison result signals of a reference comparison circuit. Referring to FIG. 4, for example, each comparison circuit included in the second group G1_2 may perform an offset calibration operation based on a calibration signal of the first comparison circuit COMP CRT 1. However, the disclosure is not limited thereto.

Hereinafter, for convenience of explanation, it is assumed that the analog-to-digital converter 100 according to the present example embodiment is an analog-to-digital converter of 8 bits, where N is 8.

Figure 5:
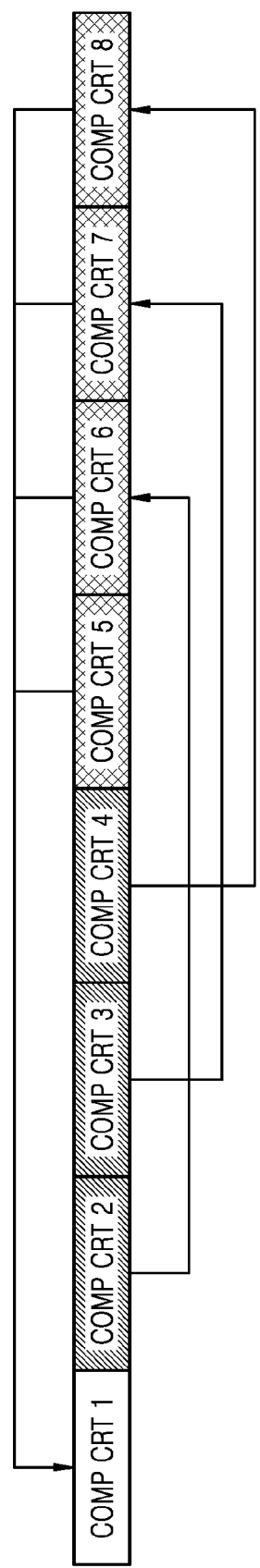
FIG. 5 is a diagram illustrating an offset calibration loop among first to eighth comparison circuits that are grouped, according to an example embodiment of the disclosure.

FIG. 5 is a diagram illustrating an offset calibration loop among first to eighth comparison circuits, which are grouped, according to an example embodiment of the disclosure.

Referring to FIG. 5, from among first to eighth comparison circuits COMP CRT 1 to COMP CRT 8, the first comparison circuit COMP CRT 1 may be a reference comparison circuit, the second to fourth comparison circuits COMP CRT 2 to COMP CRT 4 may be included in a first group, and the fifth to eighth comparison circuits COMP CRT 5 to COMP CRT 8 may be included in a second group.

The fifth to eighth comparison circuits COMP CRT 5 to COMP CRT 8 may perform an offset calibration based on the first comparison circuit COMP CRT 1. In this case, whenever an operation period arrives, comparison data signals of the fifth to eighth comparison circuits COMP CRT 5 to COMP CRT 8 may be sequentially calibrated.

The second comparison circuit COMP CRT 2 may perform an offset calibration operation based on the sixth comparison circuit COMP CRT 6 on which the offset calibration operation is performed, the third comparison circuit COMP CRT 3 may perform an offset calibration operation based on the seventh comparison circuit COMP CRT 7 on which the offset calibration operation is performed, and the fourth comparison circuit COMP CRT 4 may perform an offset calibration operation based on the eighth comparison circuit COMP CRT 8 on which the offset calibration operation is performed.

In an example embodiment, in a first operation period, the first comparison circuit COMP CRT 1 and the fifth comparison circuit COMP CRT 5 may operate simultaneously during a conversion operation of comparison circuit 5 (see FIG. 6 during operation period DP1), the control logic 150 may generate a reference signal based on a calibration signal of the first comparison circuit COMP CRT 1, and in a second operation period, the fifth comparison circuit COMP CRT 5 may adjust an offset of a comparison data signal based on the reference signal and the calibration signal. In the second operation period, the first comparison circuit COMP CRT 1 and the sixth comparison circuit COMP CRT 6 may operate simultaneously (see operation period DP2 in FIG. 6), the control logic 150 may generate a reference signal based on a calibration signal of the first comparison circuit COMP CRT 1, and in a third operation period, the sixth comparison circuit COMP CRT 6 may adjust an offset of a comparison data signal based on the reference signal and the calibration signal. In the third operation period, the second comparison circuit COMP CRT 2 and the sixth comparison circuit COMP CRT 6 may operate simultaneously (see operation period DP3 in FIG. 6), the control logic 150 may generate a reference signal based on a calibration signal of the sixth comparison circuit COMP CRT 6, and in a fourth operation period, the second comparison circuit COMP CRT 2 may adjust an offset of a comparison data signal based on the reference signal and the calibration signal. Similarly, a calibration operation may be completed in the order of the seventh comparison circuit COMP CRT 7, the third comparison circuit COMP CRT 3, the eighth comparison circuit COMP CRT 8, and the fourth comparison circuit COMP CRT 4, and a comparison data signal of each of the comparison circuits may be calibrated.

Figure 6:
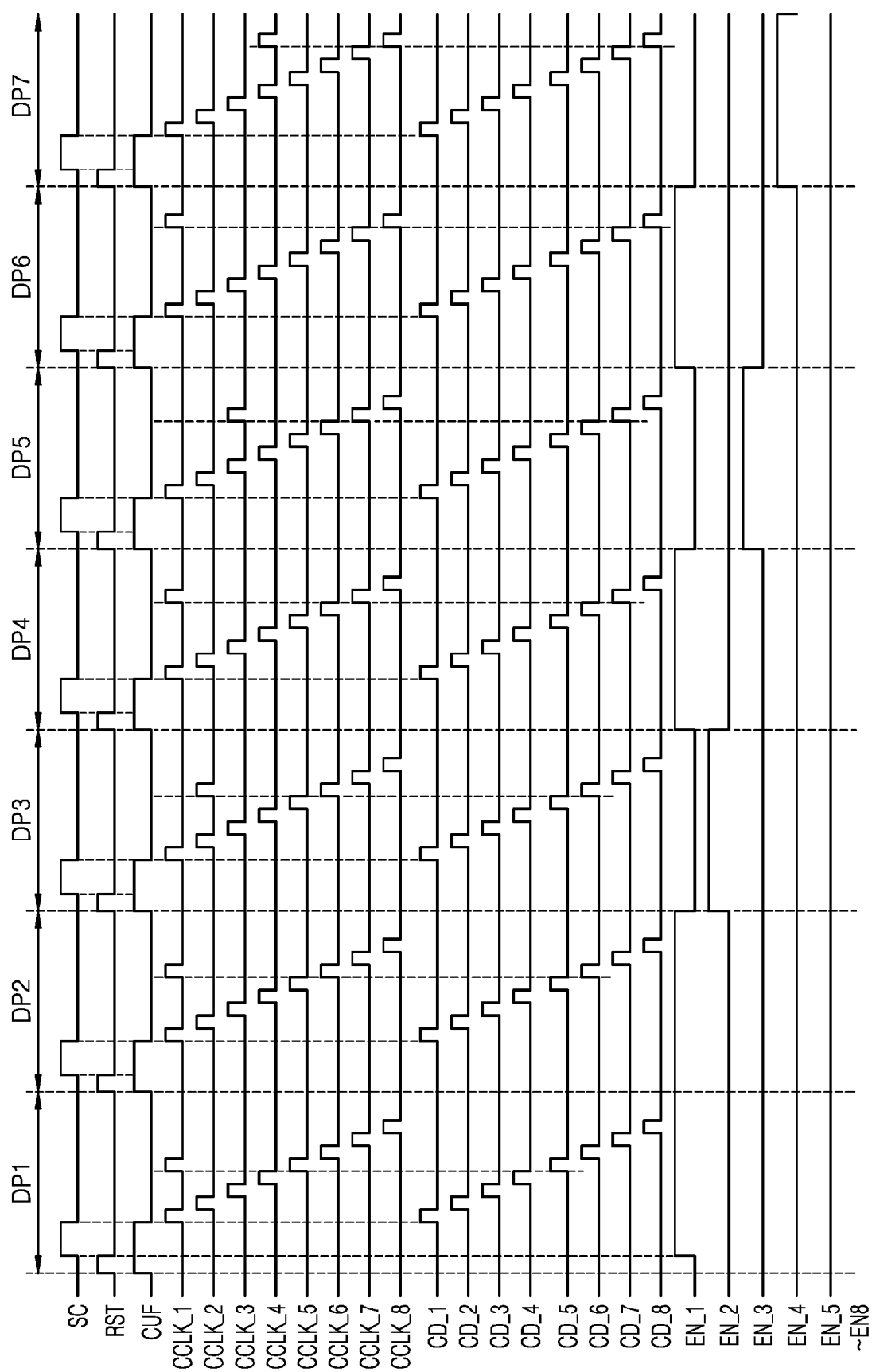
FIG. 6 is a timing diagram of a sample/hold control signal, a reset signal, a flag signal, a clock signal, a comparison completion signal, and an enable signal according to the example embodiment shown in FIG. 5.

FIG. 6 is a timing diagram of a sample/hold control signal, a reset signal, a flag signal, a clock signal, a comparison completion signal, and an enable signal according to the example embodiment shown in FIG. 5.

Referring to FIG. 6, the analog-to-digital converter 100 may sample the first and second input voltages VIN1 and VIN2 for each of a plurality of operation periods and convert the first and second input voltages VIN1 and VIN2, which are sampled, into the first to $N^{th}$ digital signals DOUT_1 to DOUT_N.

When a first operation period DP1 starts, logic levels of a reset signal RST and a flag signal CUF may be changed from a first logic level (for example, a logic low level) to a second logic level (for example, a logic high level). A logic level of the first enable signal EN_1 may be changed from the first logic level to the second logic level.

In synchronization with the change in the logic level of the reset signal RST from the second logic level to the first logic level, a logic level of the sample/hold control signal SC may be changed from the first logic level to the second logic level. In addition, in synchronization with the change in the logic level of the flag signal CUF from the second logic level to the first logic level, a logic level of the sample/hold control signal SC may be changed from the second logic level to the first logic level.

The sample/hold control signal SC, the reset signal RST, and the flag signal CUF may each have a pulse wave shape of a constant period.

In synchronization with the change in the logic levels of the sample/hold control signal SC and the flag signal CUF from the second logic level to the first logic level, first to eighth clock signals CCLK_1 to CCLK_8 may sequentially have a pulse shape. While each of the first to eighth clock signals CCLK_1 to CCLK_8 has a pulse shape, comparators included in the first to eighth comparison circuits COMP CRT 1 to COMP CRT 8 may sequentially operate. As the comparators included in the first to eighth comparison circuits COMP CRT 1 to COMP CRT 8 sequentially operate, first to $N^{th}$ comparison completion signals CD_1 to CD_8 may sequentially have a pulse shape. The example embodiment described above may be equally repeated in second to seventh operation periods DP2 to DP7.

In an example embodiment, in synchronization with the fifth clock signal CCLK_5 having a pulse shape, the first clock signal CCLK_1 may have a pulse shape. In this case, the first comparison completion signal CD_1 may not be output. The first comparison circuit COMP CRT 1 may output the first calibration signal CALD_1 to the control logic 150. The control logic 150 may output a fifth reference signal to the fifth comparison circuit COMP CRT 5 based on the first calibration signal CALD_1.

In the second operation period DP2, while the flag signal CUF maintains a pulse shape of the second logic level, the fifth comparison circuit COMP CRT 5 may perform an offset calibration operation. Specifically, the fifth comparison circuit COMP CRT 5 may compare logic levels between the fifth reference signal and a fifth comparison data signal (or a fifth calibration signal), the fifth reference signal being generated based on the first calibration signal CALD_1, and control a fifth positive offset voltage and a fifth negative offset voltage according to a result of the comparison. As the fifth positive offset voltage and the fifth negative offset voltage are controlled, the fifth comparison data signal to be output in the second operation period DP2 may be calibrated. Thus, there is an advantage in that an offset of the fifth comparison circuit COMP CRT 5 may be calibrated based on the first comparison circuit COMP CRT 1, which is the reference comparison circuit.

In the second operation period DP2, the first to eighth clock signals CCLK_1 to CCLK_8 may sequentially have a pulse shape. The first to $N^{th}$ comparison completion signals CD_1 to CD_8 may sequentially have a pulse shape. In synchronization with the sixth clock signal CCLK_6 having a pulse shape, the first clock signal CCLK_1 may have a pulse shape. In this case, the first comparison completion signal CD_1 may not be output. The control logic 150 may output a sixth reference signal to the sixth comparison circuit COMP CRT 6 based on the first calibration signal CALD_1.

In the third operation period DP3, the logic level of the first enable signal EN_1 may be changed from the second logic level to the first logic level. A logic level of the second enable signal EN_2 may be changed from the first logic level to the second logic level. While the flag signal CUF maintains a pulse shape of the second logic level, the sixth comparison circuit COMP CRT 6 may control a sixth positive offset voltage and a sixth negative offset voltage by using the sixth reference signal and a sixth comparison data signal (or a sixth calibration signal), the sixth reference signal being generated based on the first calibration signal CALD_1. As the sixth positive offset voltage and the sixth negative offset voltage are controlled, the sixth comparison data signal to be output in the third operation period DP3 may be calibrated. Thus, there is an advantage in that an offset of the sixth comparison circuit COMP CRT 6 may be calibrated based on the first comparison circuit COMP CRT 1, which is the reference comparison circuit.

In the third operation period, the second clock signal CCLK_2 may have a pulse shape in synchronization with the sixth clock signal CCLK_6 having a pulse shape. The control logic 150 may output a second reference signal to the second comparison circuit COMP CRT 2 based on the calibrated sixth comparison data signal (or the sixth calibration signal).

In the fourth operation period DP4, the logic level of the first enable signal EN_1 may be changed from the first logic level to the second logic level. The logic level of the second enable signal EN_2 may be changed from the second logic level to the first logic level. While the flag signal CUF maintains a pulse shape of the second logic level, the second comparison circuit COMP CRT 2 may control a second positive offset voltage and a second negative offset voltage by using the second reference signal and a second calibration signal, the second reference signal being generated based on the sixth comparison data signal (or the sixth calibration signal). In this case, the second calibration signal may be a signal generated when the second clock signal CCLK_2 has a second pulse shape in the third operation period DP3. Thus, there is an advantage in that an offset of the second comparison circuit COMP CRT 2 may be calibrated based on the sixth comparison circuit COMP CRT 6.

In the fourth operation period DP4, in synchronization with the seventh clock signal CCLK_7, the first clock signal CCLK_1 may be output again, and a seventh reference signal may be generated based on the first calibration signal CALD_1.

In the fifth operation period DP5, the logic level of the first enable signal EN_1 may be changed from the second logic level to the first logic level. A logic level of a third enable signal EN_3 may be changed from the first logic level to the second logic level. The seventh comparison circuit COMP CRT 7 may control a seventh positive offset voltage and a seventh negative offset voltage based on the seventh reference signal and a seventh comparison data signal. Thus, there is an advantage in that an offset of the seventh comparison circuit COMP CRT 7 may be calibrated based on the first comparison circuit COMP CRT 1.

In the fifth operation period DP5, the third clock signal CCLK_3 may have a pulse shape in synchronization with the seventh clock signal CCLK_7 having a pulse shape. In addition, a third reference signal may be output to the third comparison circuit COMP CRT 3 based on the calibrated seventh comparison data signal.

In the sixth operation period DP6, the logic level of the first enable signal EN_1 may be changed from the first logic level to the second logic level. The logic level of a third enable signal EN_3 may be changed from the second logic level to the first logic level. The third comparison circuit COMP CRT 3 may control a third positive offset voltage and a third negative offset voltage based on the third reference signal and a third calibration signal. In this case, the third calibration signal may be a signal generated when the third clock signal CCLK_3 has a second pulse shape in the fifth operation period DP5. Thus, there is an advantage in that an offset of the third comparison circuit COMP CRT 3 may be calibrated based on the seventh comparison circuit COMP CRT 7.

In the sixth operation period DP6, the first clock signal CCLK_1 may have a pulse shape in synchronization with the eighth clock signal CCLK_8 having a pulse shape. In addition, an eighth reference signal may be output to the eighth comparison circuit COMP CRT 8 based on the first calibration signal CALD_1.

In the seventh operation period DP7, the logic level of the first enable signal EN_1 may be changed from the second logic level to the first logic level. A logic level of a fourth enable signal EN_4 may be changed from the first logic level to the second logic level. The eighth comparison circuit COMP CRT 8 may control an eighth positive offset voltage and an eighth negative offset voltage based on the eight reference signal and an eighth calibration signal. Thus, there is an advantage in that an offset of the eighth comparison circuit COMP CRT 8 may be calibrated based on the first comparison circuit COMP CRT 1.

In the seventh operation period DP7, in synchronization with the eighth clock signal CCLK_8 having a pulse shape, the fourth clock signal CCLK_4 may have a pulse shape. A fourth reference signal may be generated based on an eighth comparison data signal, and in an eighth operation period after the seventh operation period DP7, the fourth comparison circuit COMP CRT 4 may control a fourth positive offset voltage and a fourth negative offset voltage based on the fourth reference signal and a fourth calibration signal. Thereby, there is an advantage in that an offset of the fourth comparison circuit COMP CRT 4 is calibrated based on the eighth comparison circuit COMP CRT 8.

As an operation period is repeated, the fifth to eighth comparison circuits COMP CRT 5 to COMP CRT 8 may be calibrated based on the first comparison circuit COMP CRT 1, the second to fourth comparison circuits COMP CRT 2 to COMP CRT 4 may be sequentially calibrated based on the sixth to eighth comparison circuits COMP CRT 6 to COMP CRT 8, which are calibrated. Thus, there is an advantage in that the second to eighth comparison circuits COMP CRT 2 to COMP CRT 8 may be calibrated based on the first comparison circuit COMP CRT 1. Thus, according to the above, by performing offset calibration only with comparison circuits included in the analog-to-digital converter 100 without a separate reference comparison circuit for offset calibration, there is an effect that a size of the analog-to-digital converter 100 may be reduced.

Figure 7:
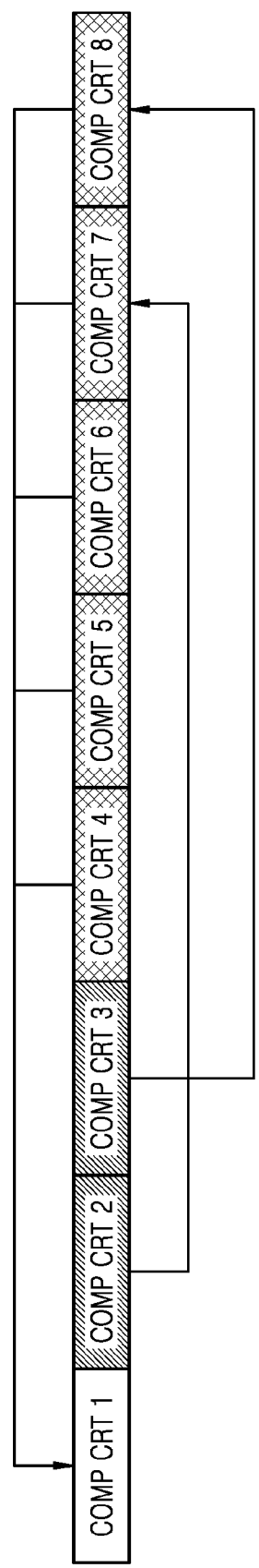
FIG. 7 is a diagram illustrating an offset calibration loop among first to eighth comparison circuits that are grouped, according to another example embodiment of the disclosure.

FIG. 7 is a diagram illustrating an offset calibration loop among first to eighth comparison circuits COMP CRT 1 to COMP CRT 8, which are grouped, according to another example embodiment of the disclosure.

Referring to FIG. 7, from among first to eighth comparison circuits COMP CRT 1 to COMP CRT 8, the first comparison circuit COMP CRT 1 may be a reference comparison circuit, the second and third comparison circuits COMP CRT 2 and COMP CRT 3 may be included in a first group, and the fourth to eighth comparison circuits COMP CRT 4 to COMP CRT 8 may be included in a second group.

The fourth to eighth comparison circuits COMP CRT 4 to COMP CRT 8 may perform an offset calibration operation based on the first comparison circuit COMP CRT 1. In addition, the second comparison circuit COMP CRT 2 may perform an offset calibration operation based on the seventh comparison circuit COMP CRT 7 performing an offset calibration operation. The third comparison circuit COMP CRT 3 may perform an offset calibration operation based on the eighth comparison circuit COMP CRT 8 performing an offset calibration operation.

For example, the fourth to seventh comparison circuits COMP CRT 4 to COMP CRT 7 may sequentially perform an offset calibration operation. In an operation period when the offset calibration operation by the seventh comparison circuit COMP CRT 7 is completed, the second comparison circuit COMP CRT 2 may perform an offset calibration operation based on a calibration signal of the seventh comparison circuit COMP CRT 7. The eighth comparison circuit COMP CRT 8 may perform an offset calibration operation, and the third comparison circuit COMP CRT 3 may perform an offset calibration operation based on a calibration signal of the eighth comparison circuit COMP CRT 8.

Figure 8:
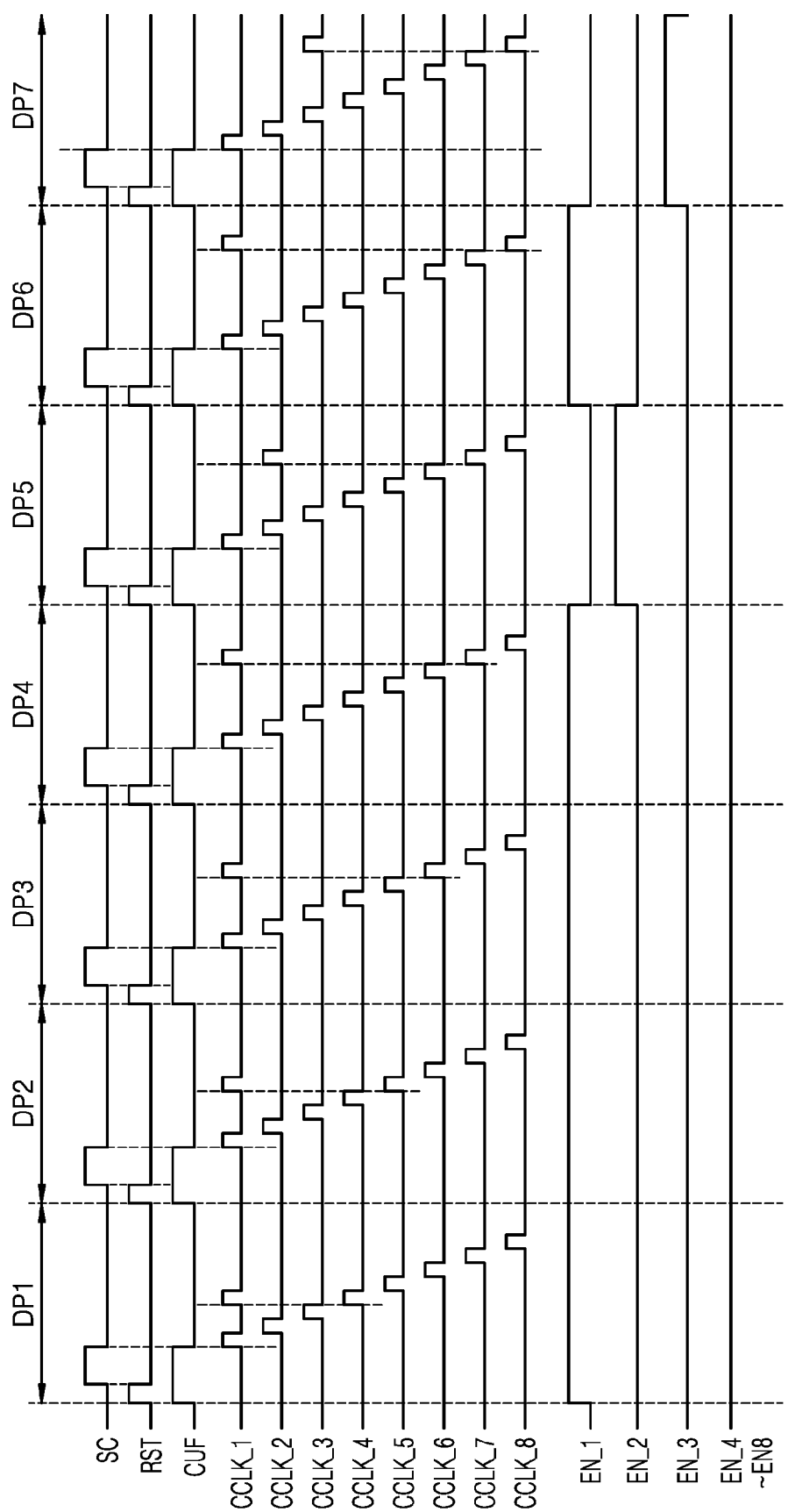
FIG. 8 is a timing diagram of a sample/hold control signal, a reset signal, a flag signal, a clock signal, a comparison completion signal, and an enable signal according to the example embodiment shown in FIG. 7.

FIG. 8 is a timing diagram of a sample/hold control signal, a reset signal, a flag signal, a clock signal, a comparison completion signal, and an enable signal according to the example embodiment shown in FIG. 7.

Referring to FIG. 8, in a first operation period DP1, a logic level of a first enable signal EN_1 may be changed from a first logic level to a second logic level. In synchronization with a fourth clock signal CCLK_4 having a pulse shape, a first clock signal CCLK_1 may have a pulse shape. A fourth reference signal may be generated based on a first calibration signal CALD_1.

In a second operation period DP2, while a flag signal CUF maintains a pulse shape of the second logic level, a fourth comparison circuit COMP CRT 4 may control a fourth positive offset voltage and a fourth negative offset voltage by using the fourth reference signal and a fourth comparison data signal. In synchronization with a fifth clock signal CCLK_5 having a pulse shape, the first clock signal CCLK_1 may have a pulse shape. A fifth reference signal may be generated based on a first calibration signal CALD_1.

In a third operation period DP3, while the flag signal CUF maintains a pulse shape of the second logic level, a fifth comparison circuit COMP CRT 5 may control a fifth positive offset voltage and a fifth negative offset voltage by using the fifth reference signal and a fifth comparison data signal. In synchronization with a sixth clock signal CCLK_6 having a pulse shape, the first clock signal CCLK_1 may have a pulse shape. A sixth reference signal may be generated based on the first calibration signal CALD_1.

In a fourth operation period DP4, while the flag signal CUF maintains a pulse shape of the second logic level, a sixth comparison circuit COMP CRT 6 may control a sixth positive offset voltage and a sixth negative offset voltage by using the sixth reference signal and a sixth comparison data signal. In synchronization with a seventh clock signal CCLK_7 having a pulse shape, the first clock signal CCLK_1 may have a pulse shape. A seventh reference signal may be generated based on the first calibration signal CALD_1.

In a fifth operation period DP5, a logic level of the first enable signal EN_1 may be changed from the second logic level to the first logic level. A logic level of a second enable signal EN_2 may be changed from the first logic level to the second logic level. While the flag signal CUF maintains a pulse shape of the second logic level, the seventh comparison circuit COMP CRT 7 may control a seventh positive offset voltage and a seventh negative offset voltage by using the seventh reference signal and a seventh comparison data signal. In synchronization with the seventh clock signal CCLK_7 having a pulse shape, a second clock signal CCLK_2 may have a pulse shape. A second reference signal may be generated based on the seventh comparison data signal (or a seventh calibration signal).

In a sixth operation period DP6, the logic level of the first enable signal EN_1 may be changed from the first logic level to the second logic level. The logic level of the second enable signal EN_2 may be changed from the second logic level to the first logic level. While the flag signal CUF maintains a pulse shape of the second logic level, a second comparison circuit COMP CRT 2 may control a second positive offset voltage and a second negative offset voltage by using the second reference signal and a second calibration signal. In this case, the second calibration signal may include a signal generated when a second clock signal CCLK_2 has a second pulse shape in the fifth operation period DP5. In synchronization with an eighth clock signal CCLK_8 having a pulse shape, the first clock signal CCLK_1 may have a pulse shape. An eighth reference signal may be generated based on the first calibration signal CALD_1.

In a seventh operation period DP7, the logic level of the first enable signal EN_1 may be changed from the second logic level to the first logic level. A logic level of a third enable signal EN_3 may be changed from the first logic level to the second logic level. While the flag signal CUF maintains a pulse shape of the second logic level, the eighth comparison circuit COMP CRT 8 may control an eighth positive offset voltage and an eighth negative offset voltage by using the eighth reference signal and an eighth comparison data signal. In synchronization with the eighth clock signal CCLK_8 having a pulse shape, a third clock signal CCLK_3 may have a pulse shape. A third reference signal may be generated based on the eighth comparison data signal (or an eighth calibration signal).

In an eighth operation period, while the flag signal CUF maintains a pulse shape of the second logic level, a third comparison circuit COMP CRT 3 may control a third positive offset voltage and a third negative offset voltage by using the third reference signal and a third calibration signal. In this case, the third calibration signal may include a signal generated when a third clock signal CCLK_3 has a second pulse shape in the seventh operation period DP7.

As an operation period is repeated, there is an effect that the second to eighth comparison circuits COMP CRT 2 to COMP CRT 8 may be calibrated based on the first comparison circuit COMP CRT 1. Thus, according to the above, by performing offset calibration only with comparison circuits included in the analog-to-digital converter 100 without a separate reference comparison circuit for offset calibration, there is an effect that a size of the analog-to-digital converter 100 may be reduced.

Figure 9:
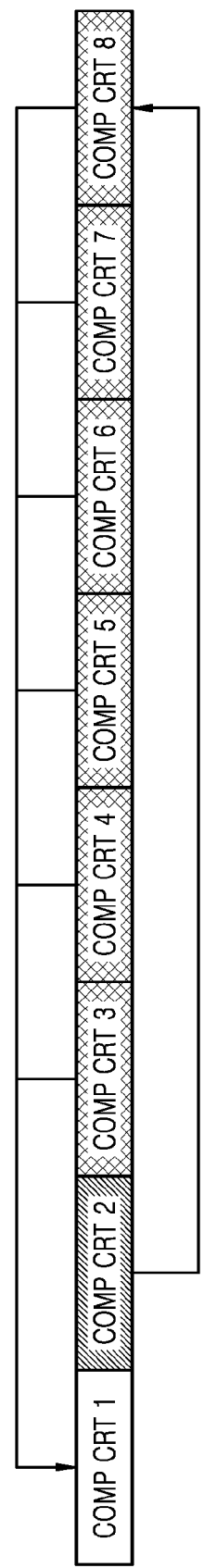
FIG. 9 is a diagram illustrating an offset calibration loop among first to eighth comparison circuits that are grouped, according to another example embodiment of the disclosure.

FIG. 9 is a diagram illustrating an offset calibration loop among first to eighth comparison circuits, which are grouped, according to another example embodiment of the disclosure.

Referring to FIG. 9, from among first to eighth comparison circuits COMP CRT 1 to COMP CRT 8, the first comparison circuit COMP CRT 1 may be a reference comparison circuit, and the second comparison circuit COMP CRT 2 may be included in a first group, and the third to eighth comparison circuits COMP CRT 3 to COMP CRT 8 may be included in a second group.

The third to eighth comparison circuits COMP CRT 3 to COMP CRT 8 may perform an offset calibration based on the first comparison circuit COMP CRT 1. In addition, the second comparison circuit COMP CRT 2 may perform an offset calibration operation based on the eighth comparison circuit COMP CRT 8 performing an offset calibration operation.

Figure 10:
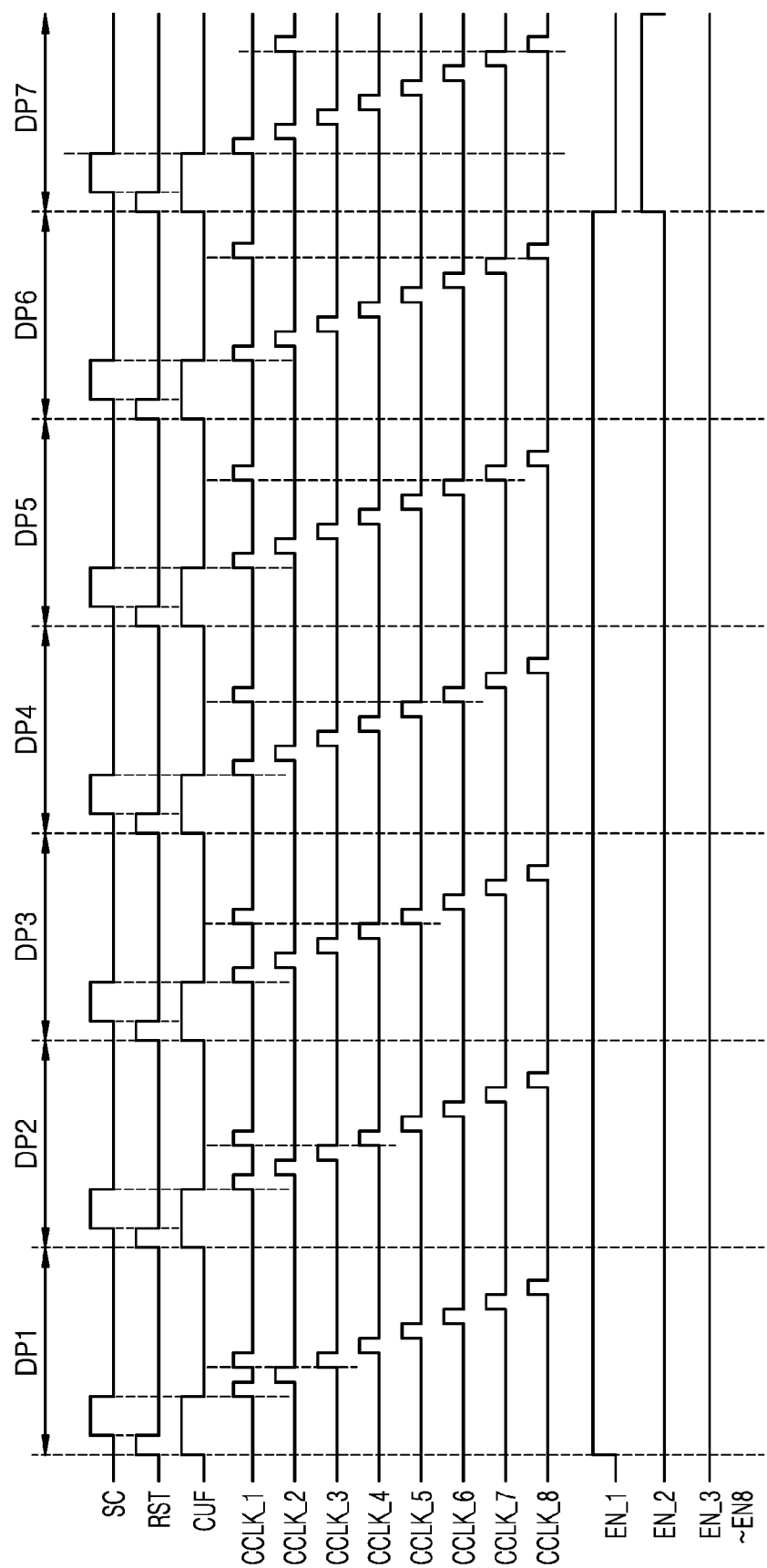
FIG. 10 is a timing diagram of a sample/hold control signal, a reset signal, a flag signal, a clock signal, a comparison completion signal, and an enable signal according to the example embodiment shown in FIG. 9.

FIG. 10 is a timing diagram of a sample/hold control signal, a reset signal, a flag signal, a clock signal, a comparison completion signal, and an enable signal according to the example embodiment shown in FIG. 9.

Referring to FIG. 10, in a first operation period DP1, a logic level of a first enable signal EN_1 may be changed from a first logic level to a second logic level. In synchronization with a fourth clock signal CCLK_4, the first clock signal CCLK_1 is additionally generated, and a third reference signal may be generated based on a first calibration signal CALD_1.

In a second operation period DP2, while a flag signal CUF maintains a pulse shape of the second logic level, the third comparison circuit COMP CRT 3 may perform an offset calibration operation based on the third reference signal and a third comparison data signal. In synchronization with the fourth clock signal CCLK_4, the first clock signal CCLK_1 may be additionally generated. A fourth reference signal may be generated based on the first calibration signal CALD_1.

In a third operation period DP3, while the flag signal CUF maintains a pulse shape of the second logic level, the fourth comparison circuit COMP CRT 4 may perform an offset calibration operation based on the fourth reference signal and a fourth comparison data signal. In synchronization with a fifth clock signal CCLK_5, the first clock signal CCLK_1 may be additionally generated. A fifth reference signal may be generated based on the first calibration signal CALD_1.

In a fourth operation period DP4, while the flag signal CUF maintains a pulse shape of the second logic level, the fifth comparison circuit COMP CRT 5 may perform an offset calibration operation based on the fifth reference signal and a fifth comparison data signal. In synchronization with a sixth clock signal CCLK_6, the first clock signal CCLK_1 may be additionally generated. A sixth reference signal may be generated based on the first calibration signal CALD_1.

In a fifth operation period DP5, while the flag signal CUF maintains a pulse shape of the second logic level, the sixth comparison circuit COMP CRT 6 may perform an offset calibration operation based on the sixth reference signal and a sixth comparison data signal. In synchronization with a seventh clock signal CCLK_7, the first clock signal CCLK_1 may be additionally generated. A seventh reference signal may be generated based on the first calibration signal CALD_1.

In a sixth operation period DP6, while the flag signal CUF maintains a pulse shape of the second logic level, the seventh comparison circuit COMP CRT 7 may perform an offset calibration operation based on the seventh reference signal and a seventh comparison data signal. In synchronization with an eighth clock signal CCLK_8, the first clock signal CCLK_1 may be additionally generated. An eighth reference signal may be generated based on the first calibration signal CALD_1.

In the seventh operation period DP7, the logic level of the first enable signal EN_1 may be changed from the second logic level to the first logic level. A logic level of a second enable signal EN_2 may be changed from the first logic level to the second logic level. While the flag signal CUF maintains a pulse shape of the second logic level, the eighth comparison circuit COMP CRT 8 may perform an offset calibration signal based on the eighth reference signal and an eighth comparison data signal. In synchronization with the eighth clock signal CCLK_8, a second clock signal CCLK_2 may be additionally generated, and a second reference signal may be generated based on the eighth comparison data signal (or an eighth calibration signal), and in an eighth operation period after the seventh operation period DP7, the second comparison circuit COMP CRT 2 may perform an offset calibration operation based on the second reference signal and a second calibration signal. In this case, the second calibration signal may include a signal generated in response to the second clock signal CCLK_2 additionally generated in the seventh operation period DP7.

According to the above, by performing offset calibration only with comparison circuits included in the analog-to-digital converter 100 without a separate reference comparison circuit for offset calibration, there is an effect that a size of the analog-to-digital converter 100 may be reduced.

Figure 11:
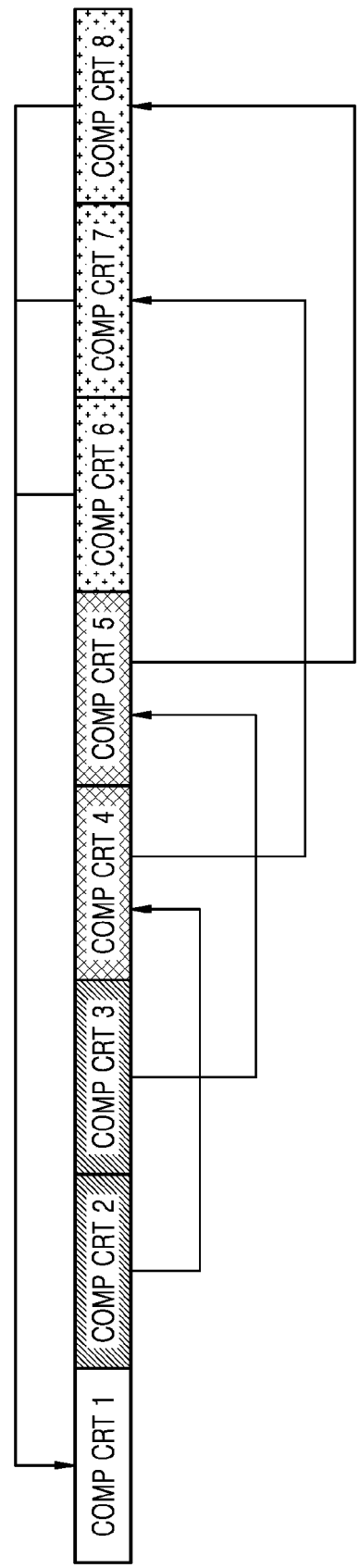
FIG. 11 is a diagram provided to describe another method of grouping comparison circuits, according to an example embodiment of the disclosure.

FIG. 11 is a diagram provided to describe another method of grouping comparison circuits, according to an example embodiment of the disclosure.

Referring to FIG. 11, unlike the example embodiment shown in FIG. 5, the comparison circuits according to an example embodiment of the present disclosure may be divided into three groups. For example, a first comparison circuit COMP CRT 1 may be a reference comparison circuit, second and third comparison circuits COMP CRT 2 and COMP CRT 3 may be included in a first group, fourth and fifth comparison circuits COMP CRT 4 and COMP CRT 5 may be included in a second group, and sixth to eighth comparison circuits COMP CRT 6 to COMP CRT 8 may be included in a third group. However, the disclosure is not limited thereto.

The sixth to eighth comparison circuits COMP CRT 6 to COMP CRT 8 may perform an offset calibration operation based on the reference comparison circuit, for example, the first comparison circuit COMP CRT 1.

The fourth comparison circuit COMP CRT 4 may perform an offset calibration operation based on the seventh comparison circuit COMP CRT 7 performing an offset calibration operation, and the fifth comparison circuit COMP CRT 5 may perform an offset calibration operation based on the eighth comparison circuit COMP CRT 8 performing an offset calibration operation.

The second comparison circuit COMP CRT 2 may perform an offset calibration operation based on the fourth comparison circuit COMP CRT 4 performing an offset calibration operation, and the third comparison circuit COMP CRT 3 may perform an offset calibration operation based on the fifth comparison circuit COMP CRT 5 performing an offset calibration operation.

In the example embodiments of the present disclosure, a plurality of comparison circuits are divided to two or three groups. However, the disclosure is not limited thereto, and the plurality of comparison circuits may be divided into four or more groups.

Figure 12:
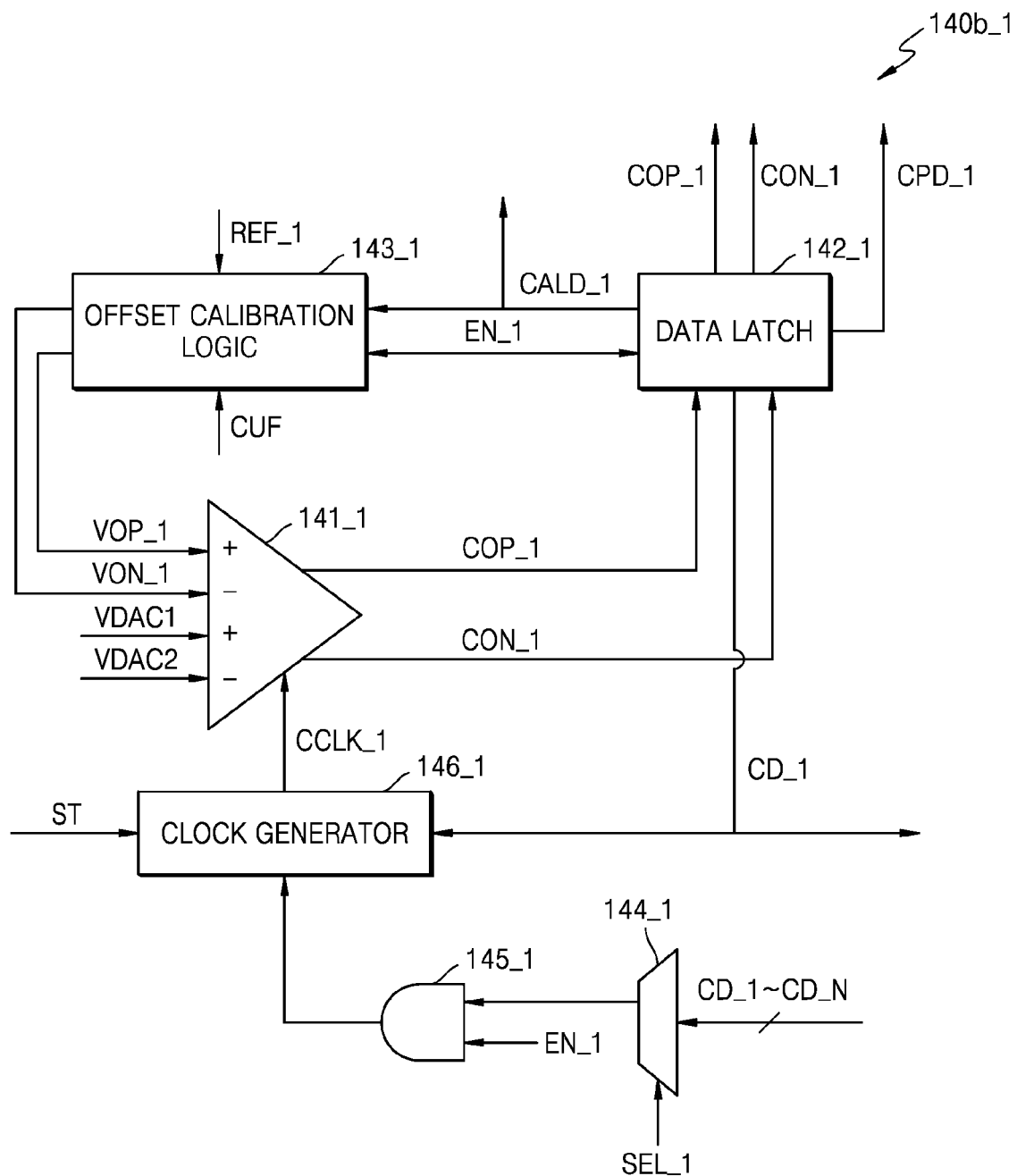
FIG. 12 is a diagram of another example of a comparison circuit.

FIG. 12 is a diagram of another example of a comparison circuit.

Referring to FIG. 12, a first comparison circuit 140b_1, like the first comparison circuit 140a_1 shown in FIG. 3A, may include a comparator 1411, a data latch 1421, an offset calibration logic 143_1, a selector 1441, an operation gate 1451, and a clock generator 146_1.

The offset calibration logic 143_1 may further receive a first enable signal EN_1. In this case, the offset calibration logic 143_1 may control a first positive offset voltage VOP_1 and a first negative offset voltage VON_1 based on a first reference signal REF_1 and a first calibration signal CALD_1, in response to a flag signal CUF and the first enable signal EN_1. Specifically, while the flag signal CUF and the first enable signal EN_1 have a second logic level, the offset calibration logic 143_1 may perform an offset calibration operation.

Second to $N^{th}$ comparison circuits are similar to the above, and redundant descriptions thereof are omitted.

According to the above, by intermittently performing an offset calibration operation, there is an effect that power consumption of the analog-to-digital converter 100 may be reduced.

Figure 13:
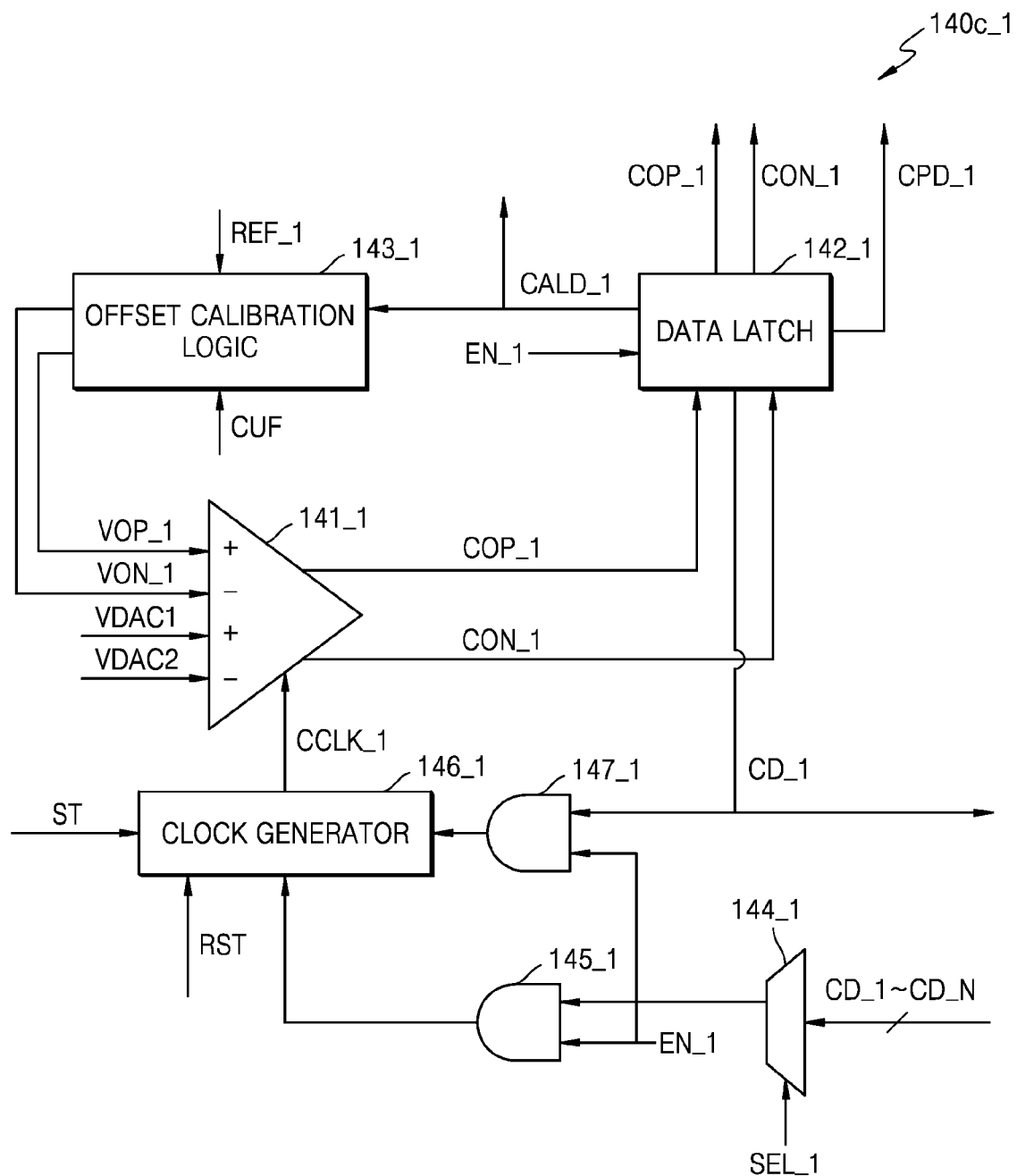
FIG. 13 is a diagram of another example of a comparison circuit.

FIG. 13 is a diagram of another example of a comparison circuit.

Referring to FIG. 13, a first comparison circuit 140c_1, like the first comparison circuit 140a_1 shown in FIG. 3A, may include a comparator 1411, a data latch 1421, an offset calibration logic 143_1, and a selector 144_1.

The first comparison circuit 140c_1 may further include a first operation gate 1451, a clock generator 146_1, and a second operation gate 147_1.

The first operation gate 1451, like the operation gate 145_1 shown in FIG. 3A or 12, may perform an AND operation of a selected comparison completion signal and a first enable signal EN_1 and output a first operation result signal to the clock generator 146_1.

The second operation gate 147_1 may perform an AND operation of a first comparison completion signal CD_1 and the first enable signal EN_1 and output a second operation result signal to the clock generator 146_1.

The clock generator 146_1 may receive a start signal ST, the first operation result signal, and the second operation result signal. The clock generator 146_1 may be reset in response to a reset signal RST.

Second to $N^{th}$ comparison circuits are similar to the above, and redundant descriptions thereof are omitted.

Figure 14:
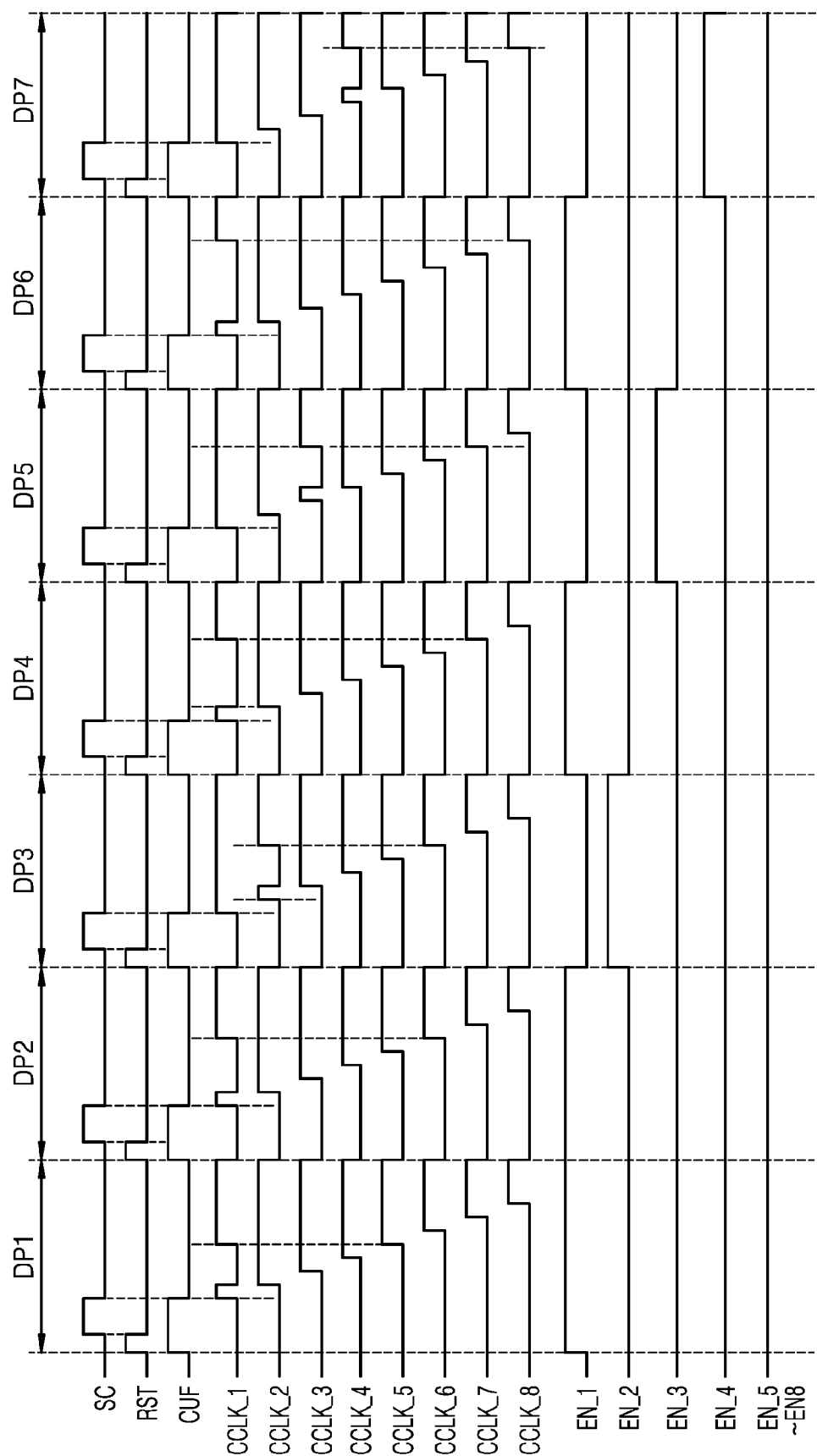
FIG. 14 is a timing diagram of a sample/hold control signal, a reset signal, a flag signal, a clock signal, a comparison completion signal, and an enable signal according to the comparison circuit shown in FIG. 13.

FIG. 14 is a timing diagram of a sample/hold control signal, a reset signal, a flag signal, a clock signal, a comparison completion signal, and an enable signal according to the comparison circuit shown in FIG. 13. For example, the timing diagram shown in FIG. 14 show signals that may be generated when grouped as shown in FIG. 5.

Referring to FIG. 14, a sample/hold control signal SC, ae reset signal RST, and a flag signal CUF are as described above with reference to FIGS. 6, 8, and 10.

In a first operation period DP1, a first clock signal CCLK_1 may have a pulse shape. When a logic level of the first clock signal CCLK_1 is changed from a second logic level to a first logic level, a logic level of a second clock signal CCLK_2 may be changed from the first logic level to the second logic level. Logic levels of third to eighth clock signals CCLK_3 to CCLK_8 may be sequentially changed from the first logic level to the second logic level. In synchronization with the change in logic level of the fifth clock signal CCLK_5 from the first logic level to the second logic level, a logic level of the first clock signal CCLK_1 may be changed from the first logic level to the second logic level.

In a second operation period DP2, the first clock signal CCLK_1 may have a pulse shape. After the logic level of the first clock signal CCLK_1 is changed from the second logic level to the first logic level, logic levels of second to eighth clock signals CCLK_2 to CCLK_8 may be sequentially changed from the first logic level to the second logic level. In synchronization with the change in logic level of the sixth clock signal CCLK_6 from the first logic level to the second logic level, the logic level of the first clock signal CCLK_1 may be changed from the first logic level to the second logic level.

In a third operation period DP3, the second clock signal CCLK_2 may have a pulse shape. After the logic level of the second clock signal CCLK_2 is changed from the second logic level to the first logic level, the logic levels of the third to eighth clock signals CCLK_3 to CCLK_8 may be sequentially changed from the first logic level to the second logic level. In synchronization with the change in logic level of the sixth clock signal CCLK_6 from the first logic level to the second logic level, the logic level of the second clock signal CCLK_2 may be changed from the first logic level to the second logic level.

In a fourth operation period DP4, the first clock signal CCLK_1 may have a pulse shape. In synchronization with the change in logic level of the seventh clock signal CCLK_7 from the first logic level to the second logic level, the logic level of the first clock signal CCLK_1 may be changed from the first logic level to the second logic level.

In a fifth operation period DP5, in synchronization with a change in logic level of the seventh clock signal CCLK_7 from the first logic level to the second logic level, the logic level of the third clock signal CCLK_3 may be changed from the first logic level to the second logic level.

In a sixth operation period DP6, in synchronization with a change in logic level of the eighth clock signal CCLK_8 from the first logic level to the second logic level, the logic level of the first clock signal CCLK_1 may be changed from the first logic level to the second logic level.

In a seventh operation period DP7, in synchronization with a change in logic level of the eighth clock signal CCLK_8 from the first logic level to the second logic level, the logic level of the fourth clock signal CCLK_4 may be changed from the first logic level to the second logic level.

Figure 15:
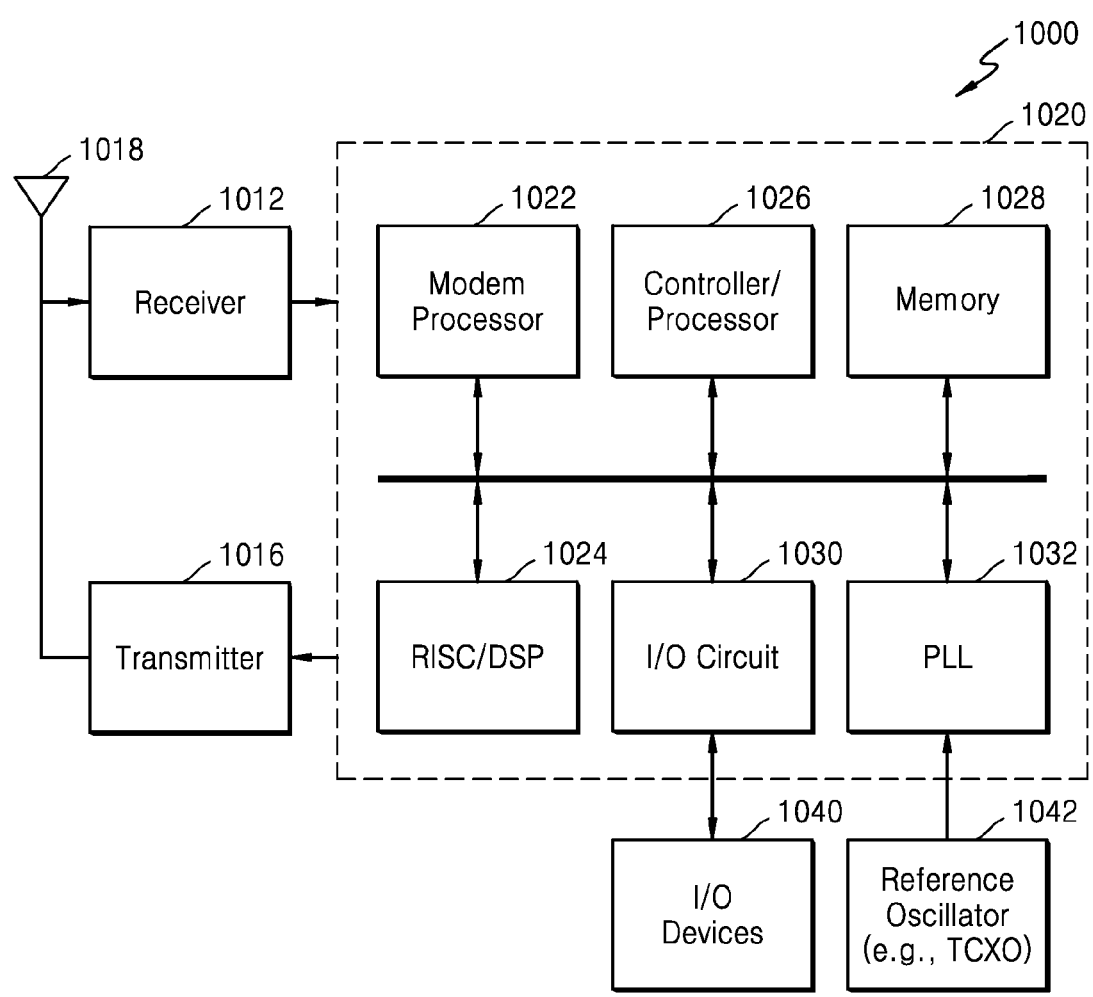
FIG. 15 is a block diagram of a communication apparatus according to an example embodiment of the disclosure.

FIG. 15 is a block diagram of a communication apparatus 1000 according to an example embodiment of the disclosure.

Referring to FIG. 15, the communication apparatus 1000 may include a receiver 1012, a transmitter 1016, a communication module 1020, an antenna 1018, input/output devices 1040, and a reference oscillator 1042. The receiver 1012 may include the analog-to-digital converter 100 shown in FIG. 1. The receiver 1012 may convert an analog signal into a digital signal by using an analog-to-digital conversion circuit, the analog signal being received from the outside via the antenna 1018, and then provide the digital signal to the communication module 1020. The transmitter 1016 may convert the digital signal into an analog signal, the digital signal being received from the communication module 1020, and then output the analog signal to the outside via the antenna 1018.

The communication module 1020 may include a modem processor 1022, a reduced instruction set computer (RISC)/ digital signal processor (DSP) 1024, a controller/processor 1026, a memory 1028, an input/output device 1030, and a phase locked loop (PLL) 1032.

The modem processor 1022 may perform a processing operation such as encoding, modulation, demodulation, and decoding for data transmission and data reception. The RISC/DSP 1024 may perform a general or specialized processing operation in the communication apparatus 1000. The controller/processor 1026 may control blocks within the communication module 1020. The memory 1028 may store data and various command codes. The input/output device 1030 may communicate with external input/output devices 1040. The input/output device 1030 may convert a data signal into a digital signal by using the analog-to-digital conversion circuit, the data signal being received from the external input/output devices 1040. The PLL 1032 may perform a frequency modulation operation by using a frequency signal received from the reference oscillator 1042. The reference oscillator 1042 may be implemented as a crystal oscillator (XO), a voltage controlled crystal oscillator (VCXO), a temperature compensated crystal oscillator (TCXO), and the like. The communication module 1020 may perform a processing operation required for communication by using an output signal generated by the PLL 1032.

Figure 16:
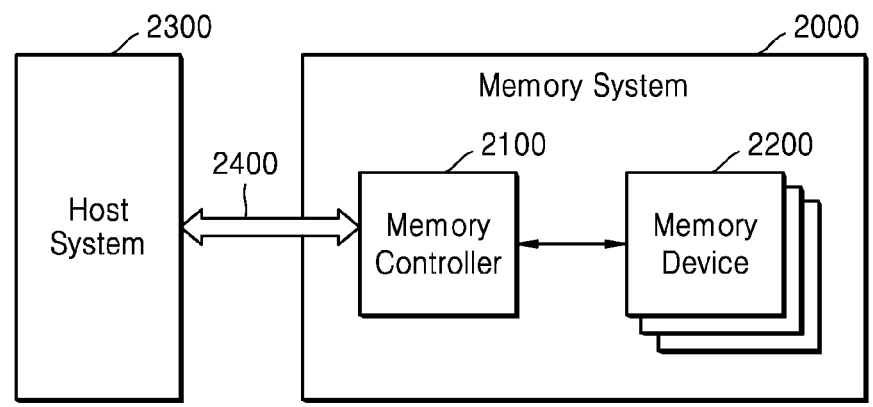
FIG. 16 is a block diagram of systems according to an example embodiment of the disclosure.

FIG. 16 is a block diagram of systems according to an example embodiment of the disclosure.

Referring to FIG. 16, a memory system 2000 and a host system 2300 may communicate with each other via an interface 2400, and the memory system 2000 may include a memory controller 2100 and memory devices 2200.

The interface 2400 may use an electrical signal and/or an optical signal, and, as non-limiting examples, may be implemented as a serial advanced technology attachment (SATA) interface, an SATA express (SATAe) interface, a serial attached small computer system interface (SAS), a Universal Serial Bus (USB) interface, or any combinations thereof. The host system 2300 and the memory controller 2100 may include a Serializer/Deserializer (SerDes) respectively.

In some example embodiments, the memory system 2000 may be removably combined with the host system 2300 to thereby communicate with the host system 2300. The memory device 2200 may be a volatile memory or a non-volatile memory, and the memory system 2000 may be referred to as a storage system. For example, as non-limiting examples, the memory system 2000 may be implemented as a solid-state drive or solid-state disk (SSD), an embedded SSD (eSSD), a multimedia card (MMC), an embedded multimedia card (eMMC), etc. The memory controller 2100 may control the memory devices 2200 in response to a request received from the host system 2300 via the interface 2400.

The analog-to-digital conversion circuit to which the example embodiments of the disclosure is applied may be implemented as being included in each of the memory controller 2100, the memory devices 2200, and the host system 2300. Specifically, the memory controller 2100, the memory devices 2200, and the host system 2300 may receive an N-level pulse-amplitude modulation (PAMn)-based data signal and convert the data signal into digital data by using a method according to the example embodiments of the disclosure.

Figure 17:
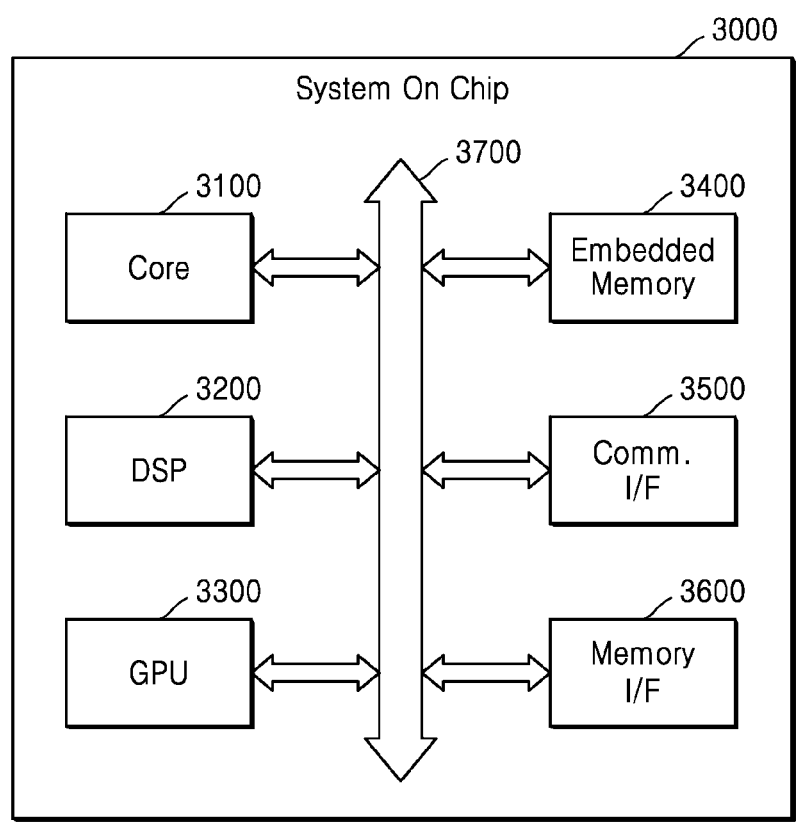
FIG. 17 is a block diagram of a system on chip according to an example embodiment of the disclosure.

FIG. 17 is a block diagram of a system on a chip 3000 according to an example embodiment of the disclosure.

Referring to FIG. 17, the system on a chip (SoC) 3000 may refer to an integrated circuit that integrates components of a computing system or other electronic system. For example, as one of the SoC 3000, an application processor (AP) may include a processor and components for other functions.

The SoC 3000 may include a core 3100, a DSP 3200, a graphics processing unit (GPU) 3300, an embedded memory 3400, a communication interface 3500, and a memory interface 3600. Elements of the SoC 3000 may communicate with one another via a bus 3700.

The core 3100 may process instructions and may control operations of the elements included in the SoC 3000. For example, by processing a series of instructions, the core 3100 may drive an operating system and execute applications on the operating system. The DSP 3200 may generate useful data from processing a digital signal, for example, a digital signal provided by the communication interface 3500. The GPU 3300 may generate data for an image output through a display apparatus from image data provided from the embedded memory 3400 or the memory interface 3600 and may encode the image data The embedded memory 3400 may store data required for the core 3100, the DSP 3200, and the GPU 3300 to operate. The memory interface 3600 may provide an interface for an external memory of the SoC 3000, such as a dynamic random-access memory (DRAM) and a flash memory.

The communication interface 3500 may provide serial communication with the outside of the SoC 3000. For example, the communication interface 3500 may be connected to Ethernet and may include SerDes for serial communication.

The analog-to-digital conversion circuit to which the example embodiments of the disclosure is applied may be applied to the communication interface 3500 and the memory interface 3600. Specifically, the communication interface 3500 or the memory interface 3600 may receive a PAMn-based data signal, and convert the data signal into digital data by using a method according to the example embodiments of the disclosure.

While example embodiments have been particularly shown and described, it will be understood that various changes in form and details may be made therein without departing from the spirit and scope of the following claims.

What is claimed is:

1. An analog-to-digital converter comprising:
a sample/hold circuit configured to sample a first input voltage and a second input voltage;
a digital-to-analog converter configured to output a first comparison voltage and a second comparison voltage based on the sampled first input voltage and the sampled second input voltage;
a plurality of comparison circuits configured to compare the first comparison voltage and the second comparison voltage to each other sequentially from a most significant bit to a least significant bit of a digital signal and output a plurality of comparison result signals;
a control logic configured to control an operation of the plurality of comparison circuits, and generate a plurality of reference signals based on the plurality of comparison result signals output from the plurality of comparison circuits; and
a digital register configured to output the digital signal based on the plurality of comparison result signals,
wherein the plurality of comparison circuits comprise:
a first comparison circuit configured to output a first comparison result signal in a first operation period;
a second comparison circuit configured to, in a second operation period after the first operation period, calibrate an offset of a second comparison result signal based on a first reference signal corresponding to the first comparison result signal from among the plurality of reference signals and output the calibrated second comparison result signal; and a third comparison circuit configured to, in a third operation period after the second operation period, calibrate an offset of a third comparison result signal based on a second reference signal corresponding to the calibrated second comparison result signal from among the plurality of reference signals and output the calibrated third comparison result signal.

2. The analog-to-digital converter of claim 1, wherein the second comparison circuit is further configured to output the second comparison result signal in the first operation period, and the first comparison circuit is further configured to output the first comparison result signal in synchronization with the second comparison circuit outputting the second comparison result signal in the first operation period.

3. The analog-to-digital converter of claim 2, wherein the second comparison circuit is further configured to compare a first logic level of the first reference signal corresponding to the first comparison result signal with a second logic level of the second comparison result signal and adjust an offset of the second comparison result signal according to a result of the comparison.

4. The analog-to-digital converter of claim 3, wherein the second comparison circuit is further configured to:
based on the first logic level of the first reference signal corresponding to the first comparison result signal being equal to the second logic level of the second comparison result signal, maintain the offset of the second comparison result signal;
based on the first logic level of the first reference signal corresponding to the first comparison result signal being greater than the second logic level of the second comparison result signal, increase the offset of the second comparison result signal; and
based on the first logic level of the first reference signal corresponding to the first comparison result signal being less than the second logic level of the second comparison result signal, reduce the offset of the second comparison result signal.

5. The analog-to-digital converter of claim 1, wherein the third comparison circuit is further configured to output the third comparison result signal in synchronization with the second comparison circuit outputting the calibrated second comparison result signal in the second operation period.

6. The analog-to-digital converter of claim 5, wherein the third comparison circuit is further configured to compare a first logic level of the first reference signal corresponding to the calibrated second comparison result signal with a second logic level of the third comparison result signal and adjust an offset of the third comparison result signal according to a result of the comparison.

7. An analog-to-digital converter comprising:
a signal generator configured to generate a sample signal and a flag signal based on an external clock signal;
a sample/hold circuit configured to sample a first input voltage and a second input voltage in response to the sample signal;
a digital-to-analog converter configured to output a first comparison voltage and a second comparison voltage based on the sampled first input voltage and the sampled second input voltage;

a first comparison circuit to an $N^{th}$ comparison circuits configured to output, sequentially from an $N^{th}$ bit to first bit of a digital signal, first to $N^{th}$ comparison result signals indicating a result of comparison between the first comparison voltage and the second comparison voltage, and first to $N^{th}$ comparison completion signals indicating that a comparison operation is completed, N being a natural number greater than or equal to 2;
a control logic configured to output, to the first to $N^{th}$ comparison circuits, first to $N^{th}$ reference signals, first to $N^{th}$ enable signals, and first to $N^{th}$ selection signals based on the first to $N^{th}$ comparison result signals; and
a digital register configured to output the digital signal based on the first to $N^{th}$ comparison result signals,
wherein each of the first to $N^{th}$ comparison circuits, associated with a corresponding reference signal, comprises:
a comparator configured to receive the first comparison voltage and the second comparison voltage, a first offset voltage and a second offset voltage, compare the first comparison voltage and the second comparison voltage to each other in response to a first clock signal, and output a comparison result signal;
a data latch configured to latch the comparison result signal, and output a comparison completion signal in response to an enable signal;
an offset calibration logic configured to control the first offset voltage and the second offset voltage based on the corresponding reference signal and the comparison result signal in response to the flag signal;
a selector configured to output a second comparison completion signal selected according to a selection signal from among the first to $N^{th}$ comparison completion signals;
an operation gate configured to perform an AND operation on the enable signal and the selected comparison completion signal and output an operation result signal; and
a clock generator configured to generate a second clock signal in response to the operation result signal and be reset in response to the comparison completion signal.

8. The analog-to-digital converter of claim 7, wherein the signal generator is further configured to further generate a start signal based on the external clock signal,
a first clock generator included in the first comparison circuit from among the first to $N^{th}$ comparison circuits is configured to generate the first clock signal in response to the start signal and generate the first clock signal in response to a first operation result signal, and
an $i^{th}$ clock generator included in an $i^{th}$ comparison circuit from among the first to $N^{th}$ comparison circuits is configured to generate an $i^{th}$ clock signal in response to an $i-1^{st}$ comparison completion signal of an $i-1^{st}$ comparison circuit and generate the $i^{th}$ clock signal in response to an $i^{th}$ operation result signal, i being a natural number between 2 and N.

9. The analog-to-digital converter of claim 7, wherein the offset calibration logic is further configured to compare a first logic level of the corresponding reference signal with a second logic level of the comparison result signal, and control the first offset voltage and the second offset voltage according to a result of the comparison.

10. The analog-to-digital converter of claim 9, wherein the offset calibration logic is further configured to:
maintain the first offset voltage and the second offset voltage based on the first logic level of the corresponding reference signal being equal to the second logic level of the comparison result signal, and change the first offset voltage and the second offset voltage based on the first logic level of the corresponding reference signal and the second logic level of the comparison result signal being different from each other.

11. The analog-to-digital converter of claim 10, wherein a voltage level of the first input voltage is greater than a voltage level of the second input voltage, a voltage level of the first comparison voltage is greater than a voltage level of the second comparison voltage, a voltage level of the first offset voltage is greater than a voltage level of the second offset voltage, and the offset calibration logic is further configured to:

increase the first offset voltage and reduce the second offset voltage based on the first logic level of the corresponding reference signal being greater than the second logic level of the comparison result signal, and reduce the first offset voltage and increase the second offset voltage based on the first logic level of the corresponding reference signal being less than the second logic level of the comparison result signal.

12. The analog-to-digital converter of claim 9, wherein the offset calibration logic is further configured to:

receive the enable signal, and control the first offset voltage and the second offset voltage based on the corresponding reference signal and the comparison result signal only during a period when each of the flag signal and the enable signal are activated.

13. The analog-to-digital converter of claim 7, wherein the data latch is further configured to:

based on the enable signal having a first logic level, output the comparison completion signal whenever the comparison result signal is received from the comparator; and based on the enable signal having a second logic level that is greater than the first logic level, output the comparison completion signal in response to the comparison result signal being initially received from the comparator in one operation period.

14. An analog-to-digital converter comprising:

a signal generator configured to generate a sample signal, a reset signal, and a flag signal based on an external clock signal;

a sample/hold circuit configured to sample a first input voltage and a second input voltage in response to the sample signal;

a digital-to-analog converter configured to output a first comparison voltage and a second comparison voltage based on the sampled first input voltage and the sampled second input voltage;

first to $N^{th}$ comparison circuits configured to output, sequentially from an $N^{th}$ bit to first bit of a digital signal, first to $N^{th}$ comparison result signals indicating a result of comparison between the first comparison voltage and the second comparison voltage, and first to $N^{th}$ comparison completion signals indicating that a comparison operation is completed, N being a natural number greater than or equal to 2;

a control logic configured to output, to the first to $N^{th}$ comparison circuits, first to $N^{th}$ reference signals, first to $N^{th}$ enable signals, and first to $N^{th}$ Selection signals based on the first to $N^{th}$ comparison result signals; and a digital register configured to output the digital signal based on the first to $N^{th}$ comparison result signals, wherein each of the first to $N^{th}$ comparison circuits, associated with a corresponding reference signal, comprises:

a comparator configured to receive the first comparison voltage, the second comparison voltage, a first offset voltage, and a second offset voltage, compare the first comparison voltage and the second comparison voltage to each other in response to a first clock signal, and output a comparison result signal;

a data latch configured to latch the comparison result signal, and output a comparison completion signal in response to an enable signal;

an offset calibration logic configured to control the first offset voltage and the second offset voltage based on the corresponding reference signal and the comparison result signal in response to the flag signal;

a selector configured to output a second comparison completion signal selected according to a selection signal from among the first to $N^{th}$ comparison completion signals;

a first operation gate configured to perform an AND operation on the enable signal and the selected comparison completion signal and output a first operation result signal;

a second operation gate configured to perform an AND operation on the enable signal and the comparison completion signal and output a second operation result signal; and a clock generator configured to generate a second clock signal in response to the first operation result signal and the second operation result signal, and be reset in response to the reset signal.

15. The analog-to-digital converter of claim 14, wherein the signal generator is further configured to further generate a start signal based on the external clock signal, a first clock generator included in the first comparison circuit from among the first to $N^{th}$ comparison circuits is configured to generate the first clock signal in response to the start signal and generate the first clock signal in response to the first operation result signal and the second operation result signal, and an $i^{th}$ clock generator included in an $i^{th}$ comparison circuit from among the first to $N^{th}$ comparison circuits is configured to generate an $i^{th}$ clock signal in response to an $i-1^{st}$ comparison completion signal of an $i-1^{st}$ comparison circuit, and generate the $i^{th}$ clock signal in response to each of the first operation result signal and the second operation result signal, i being a natural number between 2 and N.

16. The analog-to-digital converter of claim 15, wherein the offset calibration logic is further configured to:

compare a first logic level of the first reference signal and a second logic level of the comparison result signal, and control the first offset voltage and the second offset voltage according to a result of the comparison.

17. The analog-to-digital converter of claim 16, wherein the offset calibration logic is further configured to:

maintain the first offset voltage and the second offset voltage based on the first logic level of the first reference signal being equal to the second logic level of the comparison result signal, and change the first offset voltage and the second offset voltage based on the first logic level of the first reference signal and the second logic level of the comparison result signal being different from each other.

18. The analog-to-digital converter of claim 17, wherein a voltage level of the first input voltage is greater than a voltage level of the second input voltage,
- a voltage level of the first comparison voltage is greater than a voltage level of the second comparison voltage,
- a voltage level of the first offset voltage is greater than a voltage level of the second offset voltage, and
- the offset calibration logic is further configured to:
- increase the first offset voltage and reduce the second offset voltage based on the first logic level of the corresponding reference signal being greater than the second logic level of the comparison result signal, and
- reduce the first offset voltage and increase the second offset voltage based on the first logic level of the corresponding reference signal being less than the second logic level of the comparison result signal.

19. The analog-to-digital converter of claim 18, wherein the offset calibration logic is further configured to:
- receive the enable signal, and
- control the first offset voltage and the second offset voltage based on the corresponding reference signal and the comparison result signal only during a period when each of the flag signal and the enable signal are activated.

20. The analog-to-digital converter of claim 14, wherein the data latch is further configured to:
- based on the enable signal having a first logic level, output the comparison completion signal whenever the comparison result signal is received from the comparator; and
- based on the enable signal having a second logic level greater than the first logic level, output the comparison completion signal in response to the comparison result signal being initially received from the comparator in one operation period.

* * * * *